US00RE46022E

(19) United States
(12) Reissued Patent
Kawazoe et al.

(10) Patent Number: US RE46,022 E
(45) Date of Reissued Patent: May 31, 2016

(54) NONVOLATILE SEMICONDUCTOR STORAGE DEVICE AND METHOD FOR OPERATING SAME

(71) Applicant: Xenogenic Development Limited Liability Company, Wilmington, DE (US)

(72) Inventors: Hidechika Kawazoe, Kitakatsuragi-gun (JP); Yukio Tamai, Tsuchiura (JP)

(73) Assignee: Xenogenic Development Limited Liability Company, Wilmington, DE (US)

(21) Appl. No.: 13/939,833

(22) Filed: Jul. 11, 2013

Related U.S. Patent Documents

Reissue of:
(64) Patent No.: 7,978,495
Issued: Jul. 12, 2011
Appl. No.: 11/883,552
PCT Filed: Jan. 5, 2006
PCT No.: PCT/JP2006/300041
§ 371 (c)(1),
(2) Date: Sep. 17, 2008
PCT Pub. No.: WO2006/082695
PCT Pub. Date: Aug. 10, 2006

(30) Foreign Application Priority Data

Feb. 2, 2005 (JP) ..... 2005-025935

(51) Int. Cl.
*G11C 13/00* (2006.01)

(52) U.S. Cl.
CPC ..... *G11C 13/0021* (2013.01); *G11C 13/0002* (2013.01); *G11C 13/004* (2013.01); *G11C 13/0069* (2013.01)

(58) Field of Classification Search
CPC ..... G11C 13/0002; G11C 13/004; G11C 13/0069; G11C 13/0021
USPC ..... 365/148, 189.09, 189.011
See application file for complete search history.

(56) References Cited

U.S. PATENT DOCUMENTS 4,199,692 A * 4/1980 Neale ..... 365/163
6,204,139 B1 3/2001 Liu et al.

(Continued)

FOREIGN PATENT DOCUMENTS

EP 1 489 620 11/2004
EP 1 489 620 12/2004

(Continued)

OTHER PUBLICATIONS

Chen et al., An access-transistor-free (OT/1R) non-volatile resistance random access memory (RRAM) using a novel threshold switching, self-rectifying chalcogenide device, IEDM, 2003, pp. 905-908.

(Continued)

*Primary Examiner* — Amir Zarabian
*Assistant Examiner* — Jay Radke

(57) ABSTRACT

A nonvolatile semiconductor memory device for suppressing a current consumption caused by a transient current because of the potential change of the bit and word lines at the time of shifting between the programming, reading, and erasing actions in a highly integrated memory cell array is provided. A memory cell (1) array comprises two-terminal memory cells each having a variable resistance element whose resistance value reversibly changes by pulse application are arranged in a row and column directions, wherein the memory cells in a row are connected at one end to common word lines (WL1 to WLn), the memory cells in a column are connected at the other end to common bit lines (BL1 to BLm), and a common unselected voltage $V_{WE}/2$ is applied to both unselected word and bit lines not connected to the selected memory cell during the reading, programming, and erasing actions for the selected memory cell.

60 Claims, 35 Drawing Sheets

(56) References Cited

U.S. PATENT DOCUMENTS

| | | | | |
|---|---|---|---|---|
| 6,259,644 | B1 | 7/2001 | Tran et al. | |
| 6,992,920 | B2 * | 1/2006 | Tamai et al. | 365/189.15 |
| 2003/0223266 | A1 | 12/2003 | Yamamura | |
| 2004/0160819 | A1 * | 8/2004 | Rinerson et al. | 365/171 |
| 2004/0174729 | A1 * | 9/2004 | Sakai et al. | 365/145 |
| 2004/0257852 | A1 | 12/2004 | Yamamura | |
| 2004/0257864 | A1 | 12/2004 | Tamai et al. | |
| 2005/0041467 | A1 * | 2/2005 | Chen | 365/184 |

FOREIGN PATENT DOCUMENTS

| | | |
|---|---|---|
| JP | 08-115986 | 5/1996 |
| JP | 8-115986 A | 5/1996 |
| JP | 2003-281885 | 10/2003 |
| JP | 2004-152893 | 5/2004 |
| JP | 2004-152993 A | 5/2004 |
| JP | 2004-310641 | 11/2004 |

OTHER PUBLICATIONS

International Preliminary Report on Patentability for PCT/JP2006/300041, issued Aug. 7, 2007.

International Search Report for PCT/JP2006/300041, mailed Apr. 11, 2006.

Notice of Allowance on U.S. Appl. No. 11/883552, mailed Mar. 3, 2011.

Liu et al, "Electric-pulse-induced reversible resistance change effect in magnetoresistive films", Applied Physics Letters, vol. 76, No. 19, May 8, 2000, pp. 2749-2751.

* cited by examiner

NONVOLATILE SEMICONDUCTOR STORAGE DEVICE AND METHOD FOR OPERATING SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is *a Reissue of U.S. Pat. No. 7,978,495 (previously U.S. patent application Ser. No. 11/883,552, filed Jan. 5, 2006), which is* a National Phase filing under 35 U.S.C. §371 of International Application No. PCT/JP2006/300041 filed on Jan. 5, 2006, and which claims priority to Japanese Patent Application No. 2005-025935 filed on Feb. 2, 2005.

TECHNICAL FIELD

The present invention relates to a semiconductor memory device having a memory cell array in which a plurality of two-terminal memory cells comprising a variable resistance element having a resistance value reversibly changed by electric pulse application and storing information by the change of the electric resistance are arranged in a row direction and a column direction, and more particularly, to a voltage control technique for bit lines and word lines in each memory action of reading, programming and erasing actions.

BACKGROUND ART

Recently, as a next-generation NVRAM (Nonvolatile Random Access Memory) capable of implementing high-speed action to be replaced with a flash memory, various kinds of device structures such as a FeRAM (Ferroelectric RAM), a MRAM (Magnetic RAM), and an OUM (Ovonic Unified Memory) have been competitively developed in view of implementing high performance, high reliability, low cost, and process consistency.

In addition, based on these existing technique, a method of changing electric resistance reversely by applying an electric pulse to the perovskite material known for a super colossal magnetoresistance effect is disclosed by Shangquing Liu, Alex Ignatiev et al. in University of Houston, in the following patent document 1 and non-patent document 1. This is extremely innovative because resistance change over several digits can be implemented at a room temperature without applying an electric field while using the perovskite material known for the super colossal magnetoresistance effect. A resistance nonvolatile RRAM (Resistance Random Access Memory) using a variable resistance element and employing this phenomenon is extremely low in power consumption because it does not need a magnetic field at all unlike the MRAM and easy to miniaturize and highly integrate and has a considerably large dynamic range of the resistance change as compared with the MRAM, so that it has excellent characteristics such that multilevel storage can be implemented. The basic structure in an actual device is considerably simple such that a lower electrode material, a provskite-type metal oxide, and an upper electrode material are laminated in this order on a substrate in the vertical direction. In addition, according to the element structure illustrated in patent document 1, the lower electrode material is yttrium-barium-copper oxide $YBa_2Cu_3O_7$ (YBCO) film deposited on a single-crystal substrate of lanthanum-aluminum oxide $LaAlO_3$ (LAO), the perovskite-type metal oxide is a crystalline praseodymium-calcium-manganese oxide $Pr_{1-x}Ca_xMnO_3$ (PCMO) film, and the upper electrode material is an Ag film deposited by sputtering. According to the action of the memory element, it is reported that the resistance can be reversibly changed by applying positive and negative voltage pulse of 51 volts between the upper and lower electrodes. The novel nonvolatile semiconductor memory device is implemented by reading the resistance value in this reversible resistance changing action (referred to as the "switching action" occasionally hereinafter).

A nonvolatile semiconductor memory device is constituted such that a memory cell array in which memory cells comprising a variable resistance element consisting of the PCMO film and the like and storing information by the change of the electric resistance of the variable resistance element are arranged in a row direction and column direction like a matrix is formed, and circuits for controlling data programming, erasing and reading for each memory cell in the memory cell array are disposed around the memory cell array.

As the constitution of the memory cell comprising the variable resistance element, a two-terminal memory cell comprising only the variable resistance element is called a 1R type memory cell.

FIG. 1 shows one constitution example of a large-capacity nonvolatile semiconductor memory device in which a memory cell array 1 has 1R type memory cells as components. As shown in FIG. 2, a 1R type memory cell 10 comprises a single variable resistance element and the memory cells 10 are arranged in a matrix shape to constitute the memory cell array 1, which is similar to that disclosed in the following patent document 2, for example. More specifically, the memory cell array 1 is constituted such that m×n memory cells 10 are disposed at intersections of m (BL1 to BLm) bit lines extending in the column direction and n (WL1 to WLn) word lines extending in the row direction. According to each memory cell 10, the upper electrode of the variable resistance element is connected to the word line, and the lower electrode of the variable resistance element is connected to the bit line. In addition, the relation between the upper electrode and the lower electrode of the variable resistance element may be reversed such that the lower electrode of the variable resistance element is connected to the word line and the upper electrode of the variable resistance element is connected to the bit line.

As shown in FIG. 1, according to the nonvolatile semiconductor memory device comprising the memory cell array 1 comprising the 1R type memory cells 10, a specific memory cell in the memory cell array 1 corresponding to an address input inputted to a control circuit 6a from an address line 4 is selected by a bit line decoder 2 and a word line decoder 3, and each action of data programming, erasing and reading is carried out so that data is stored in the selected memory cell and read. The data input/output with an external device (not shown) is performed through a data line 5.

The word line decoder 3 selects the word line of the memory cell array 1 according to a signal inputted to the address line 4. The bit line decoder 2 selects the bit line of the memory cell array 1 according to an address signal inputted to the address line 4. The control circuit 6a controls each action of data programming, erasing and reading of the memory cell array 1. The control circuit 6a controls the word line decoder 3, the bit line decoder 2, a voltage switch circuit 8a, and programming, erasing and reading action of the memory cell array 1, based on the address signal inputted from the address line 4, a data input (at the time of programming) inputted from a data line 5, and a control input signal inputted from a control signal line 7. In the example shown in FIG. 1, the control circuit 6a is provided with a function as a general address buffer circuit, data input/output buffer circuit, and control input buffer circuit though they are not shown.

The voltage switch circuit 8a switches each voltage of the word line and bit line required for the reading action, programming action and erasing action of the memory cell array 1 according to an action mode and supplies it to the memory cell array 1. Here, reference character Vcc designates a power supply voltage of the nonvolatile semiconductor memory device of the present invention, reference character Vss designates the ground voltage, reference character Vpp designates a programming or erasing voltage, and reference character V1 designates a reading voltage. In addition, the data reading is carried out from the memory cell array 1 through the bit line decoder 2 and the reading circuit 9. The reading circuit 9 determines the state of the data and transfers its result to the control circuit 6a to be outputted to the data line 5.

In the memory cell array 1 comprising the 1R type memory cells 10, a reading current flowing in the memory cell selected by the row or column is detected as the reading current of the memory cell to be read. Although the reading current flows in other memory cells of the memory cell array 1 comprising the 1R type memory cells 10, there are advantages that the memory cell structure is simple and the memory cell area and memory cell array area are small.

A conventional example of an electric pulse applying process to each part in the memory cell array 1 comprising the 1R type memory cells 10 at the time of data reading action will be described with reference to FIGS. 2 and 3. When the data in the selected memory cell is read, the selected word line connected to the selected memory cell is kept at Vss and the reading voltage V1 is applied to unselected word lines and all the bit lines during a reading period Tr. During the reading period Tr, since the voltage difference of the reading voltage V1 is generated between the selected word line and all the bit lines, a reading current corresponding to its electric resistance, that is, the memory state flows in the variable resistance element of the selected memory cell, so that the data stored in the selected memory cell can be read. In this case, since the reading current corresponding to the memory state of the selected memory cell connected to the selected word line flows in each bit line, when the reading current flowing in a certain selected bit line is selectively read on the bit line side, the data in the specific selected memory cell can be read. Here, the relation of the bit line and the word line may be switched such that the reading current flowing in each word line is selectively read on the word line side.

FIG. 5 shows a conventional example of an electric pulse applying method to each word line and each bit line at the time of data reading, programming or erasing action in the memory cell array 1 comprising the 1R type memory cells 10, and FIG. 4 shows one example of a nonvolatile semiconductor memory device for controlling it. The example of the electric pulse applying method to each word line and each bit line shown in FIG. 5 is similar to that disclosed in a non-patent document 2. When data is read, programmed or erased in the selected memory cell, the ground voltage Vss is applied to one of the selected word line and the selected bit line connected to the selected memory cell and a voltage Va required for implementing the reading action, programming action or erasing action is applied to the other of the selected word line or the selected bit line. The voltage of all unselected word lines and all unselected bit lines is set to the half of the voltage Va required for implementing the reading, programming or erasing action, that is, Va/2.

The nonvolatile semiconductor memory device having the constitution shown in FIG. 4 is basically the same as that of the conventional nonvolatile semiconductor memory device shown in FIG. 1. It is different from the conventional nonvolatile semiconductor memory device shown in FIG. 1 in the voltage supplied from the voltage switch circuit 8b to each word line and each bit line of the memory cell array 1 and a control method of that voltage. According to the constitution shown in FIG. 4, the voltage switch circuit 8b applies the voltages Va and Va/2 to a certain bit line and word line in addition to the voltage Vcc and Vss.

FIG. 7 shows another conventional example of an electric pulse applying method to each word line and each bit line at the time of data reading, programming or erasing action in a memory cell array 1 comprising 1R type memory cells 10, and FIG. 6 shows one example of a nonvolatile semiconductor memory device for controlling it. The example of the electric pulse applying method to each word line and each bit line shown in FIG. 7 is similar to that disclosed in the non-patent document 2. When data is read, programmed or erased for the selected memory cell, the ground voltage Vss is applied to one of the selected word line and the selected bit line connected to the selected memory cell and a voltage Va required for implementing the reading action, programming action or erasing action is applied to the other of the selected word line or the selected bit line. A voltage of two thirds of the voltage Va required for the reading, programming or erasing action, that is, 2Va/3 is applied to all unselected lines on the side to which the ground voltage Vss is applied, among the word lines and bit lines. A voltage of one third of the voltage Va, that is, Va/3 is applied to all unselected lines on the side to which the voltage Va is applied, among the word lines and bit lines.

The nonvolatile semiconductor memory device having the constitution shown in FIG. 6 is basically the same as that of the conventional nonvolatile semiconductor memory device shown in FIG. 1. It is different from the conventional nonvolatile semiconductor memory device shown in FIG. 1 in the voltage supplied from a voltage switch circuit 8c to each word line and each bit line of the memory cell array 1 and a control method of that voltage. According to the constitution shown in FIG. 6, the voltage switch circuit 8c applies the voltages Va, 2Va/3 and Va/3 to a certain bit line and word line in addition to the voltages Vcc and Vss.

The variable resistance element constituting the 1R type memory cell includes a phase-change memory element in which a resistance value is changed by the change in crystalline/amorphous state of chalcogenide compound, a MRAM element using a resistance change by a tunnel magnetic resistance effect, a memory element of a polymer ferroelectric RAM (PERAM) in which a resistance element is formed of a conductive polymer, a RRAM element causing a resistance change by an electric pulse application and the like.

Patent document 1: U.S. Pat. No. 6,204,139

Patent document 2: Japanese Unexamined Patent Publication No. 2002-8369

Non-patent document 1: Liu, S. Q. et al. "Electric-pulse-induced reversible Resistance change effect in magnetoresistive films", Applied Physics Letter, Vol. 76, pp. 2749-2751, in 2000.

DISCLOSURE OF THE INVENTION

Problem to be Solved by the Invention

In order to implement the reading, programming or erasing action of data for a memory cell array constituting 1R type memory cells, it is necessary to apply a predetermined voltage to each of a selected word line, a selected bit line, unselected word lines and unselected bit lines. When each word line and each bit line are brought to the predetermined voltage level, a transient current due to charging and discharging of parasitic capacity in the word line and bit line is generated. When each action mode of the reading, programming and erasing actions is moved to another action mode, the transient current due to the above charging and discharging of the parasitic capacity flows, causing current consumption to be increased in a nonvolatile semiconductor memory device.

Using the electric pulse applying method (refer to FIG. 5) to each word line and each bit line disclosed in the non-patent document 2, a case where data 0 is read from the selected memory cell storing the data 0 and then different data 1 is programmed will be described. At the time of reading, either the selected word line or the selected bit line connected to the selected memory cell is set at the ground voltage Vss, and the other of the selected word line or the selected bit line is set at a reading voltage Vread required for the reading action. The voltage of the all the unselected word lines and all the unselected bit lines is set to the half of the reading voltage Vread, that is, Vread/2. At the time of programming, either the selected word line or the selected bit line connected to the selected memory cell is set at the ground voltage Vss, and the other of the selected word line or the selected bit line is set at a programming voltage Vwrite required for the programming action. The voltage of the all the unselected word lines and all the unselected bit lines is set to the half of the programming voltage Vwrite, that is, Vwrite/2. At the time of shifting from the reading action to the programming action, when it is assumed that the selected memory cell at the time of the reading is the same as the selected memory cell at the time of programming for simplifying the description, the voltage of all the unselected word lines and all the unselected bit lines is increased from the Vread/2 at the time of reading to the Vwrite/2 at the time of programming. Namely, a voltage change of (Vwrite−Vread)/2 is generated in the signal lines of the total number of the unselected bit lines and the unselected word lines. Although one of the voltages of the selected bit line and the selected word line is the ground voltage Vss and it is not changed at the time of reading and programming, the other one of the selected bit line or the selected word line is increased from Vread to Vwrite. When the voltage of the bit line and word line other than one selected bit line or selected word line set at the ground voltage Vss is changed at the time of shifting from the reading action to the programming action, parasitic capacity is charged in the word line and bit line, so that the current consumption at the time of the action is increased.

In addition, when the reading is performed after the programming, although the direction is opposite to the above, the voltage of all the unselected word lines and all the unselected bit lines is lowered from the Vwrite/2 at the time of programming to the Vread/2 at the time of reading, so that the parasitic capacity is discharged in the word line and bit line and the current consumption at the time of the action is increased.

In each action of the reading, programming and erasing action, when specific bit line and word line are selected from all the bit lines and word lines, an action preparing period (precharging period) is provided just before shifting to each action and after all the bit lines and word lines are set in an unselected state once, the specific bit line and word line are shifted from the unselected states to selected states. In this case, since only the voltage of the selected word line and selected bit line is changed in the same action mode, the current consumption can be prevented from being increased. However, even in the case where the precharging period is provided just before shifting to each action, since the voltage level of the unselected word lines and the unselected bit lines is different between the reading action, programming action and erasing action similar to the case where the reading action, programming action or the erasing action is directly shifted, the same problem is generated.

The present invention was made in view of the above problems and it is an object of the present invention to provide a nonvolatile semiconductor memory device capable of controlling a current consumption increased by a transient current because of the potential change of the bit line and word line at the time of shifting between the action modes of reading, programming and erasing, in a highly integrated memory cell array, and its operating method.

Means for Solving the Problems

A nonvolatile semiconductor memory device according to the present invention to attain the above object is characterized by comprising a memory cell array comprising two-terminal memory cells each comprising a variable resistance element having a resistance value reversibly changed by electric pulse application, and arranged in a row direction and column direction such that one end of each memory cell in the same row is connected to a common word line and the other end of each memory cell in the same column is connected to a common bit line, a memory cell selecting circuit selecting the memory cell from the memory cell array by the row, column or memory cell, a voltage switch circuit applying a voltage required for each of a plurality of memory actions including reading, programming and erasing in the memory cell selected by the memory cell selecting circuit, to the selected word line and the selected bit line connected to the selected memory cell and to the unselected word lines and the unselected bit lines other than the above selected word line and selected bit line among the word lines and the bit lines, according to the memory action, and a reading circuit reading the information stored in the memory cell to be read in the selected memory cells by detecting the amount of a reading current flowing according to the resistance value of the variable resistance element in the memory cell to be read, wherein the voltage switch circuit applies a common unselect voltage to both unselected word lines and unselected bit lines during each action period for the reading, programming and erasing actions.

In addition, the nonvolatile semiconductor memory device according to the present invention is characterized in that the voltage switch circuit applies a common unselect voltage to one of the unselected word lines and the unselected bit lines at least in each action period for the reading action and the programming action, and applies the common unselect voltage to the other of the unselected word lines and the unselected bit lines at least in each action period for the reading action and the erasing action.

Furthermore, the nonvolatile semiconductor memory device according to the present invention is characterized in that the voltage switch circuit applies the unselect voltage to at least the unselected word lines and the unselected bit lines in each action preparing period just before each memory action of the reading, programming and erasing actions.

An operating method of a nonvolatile semiconductor memory device according to the present invention to attain the above object is for operating a nonvolatile semiconductor memory device comprising a memory cell array comprising two-terminal memory cells each comprising a variable resistance element having a resistance value reversibly changed by electric pulse application, and arranged in a row direction and column direction such that one end of each memory cell in the same row is connected to a common word line and the other end of each memory cell in the same column is connected to a common bit line, for a plurality of memory actions comprising a reading action, a programming action and an erasing action in a selected memory cell selected from the memory cell array by the row, column, or memory cell, and it is characterized in that a common unselect voltage is applied to both unselected word lines and unselected bit lines that are not connected to the selected memory cell in the word lines and the bit lines in each action period of the reading action, programming action and erasing action.

In addition, the operating method of the nonvolatile semiconductor memory device according to the present invention is characterized in that a common unselect voltage is applied to one of the unselected word lines and the unselected bit lines that are not connected to the selected memory cell among the word lines and bit lines at least in each action period of the reading action and programming action, and the common unselect voltage is applied to the other of the unselected word lines and the unselected bit lines at least in each action period of the reading action and erasing action.

Furthermore, the operating method of the nonvolatile semiconductor memory device according to the present invention is characterized in that the unselect voltage is applied to the unselected word lines and the unselected bit lines in each action preparing period just before each memory action of the reading, programming and erasing actions.

Effects of the Invention

According to the nonvolatile semiconductor memory device and the operating method of the nonvolatile semiconductor memory device having the above characteristics, since the voltage applied to at least one of the unselected word lines and unselected bit lines is common unselect voltage in the reading action and the programming action, or in the reading action and the erasing action, the voltage of at least one of the unselected word lines and the unselected bit lines is not changed at the time of shifting between the action modes, so that at least the number of the word lines and bit lines causing the voltage change at the time of shifting between the action modes can be reduced, and the transient current caused by the charging and discharging of the parasitic capacity in each word line and each bit line can be reduced, whereby the current consumption at the time of action can be reduced. Especially, when the voltages applied to both unselected word lines and unselected bit lines are the common unselect voltage in all the action modes of reading, programming and erasing, the current consumption reducing effect at the time of the action becomes more excellent.

Furthermore, even when the action preparing period (precharging period) is provided just before each action, in the case of shifting from the action preparing period for one action mode to the action preparing period for another action mode or to another action mode, or in the reverse case, since the voltage of both unselected word lines and unselected bit lines is not changed, the number of the word lines and bit lines whose voltage is changed at the time of shifting between the action modes can be considerably reduced, whereby the current consumption reducing effect at the time of action can become more excellent.

EXPLANATION OF REFERENCE CHARACTERS

Figure 1:
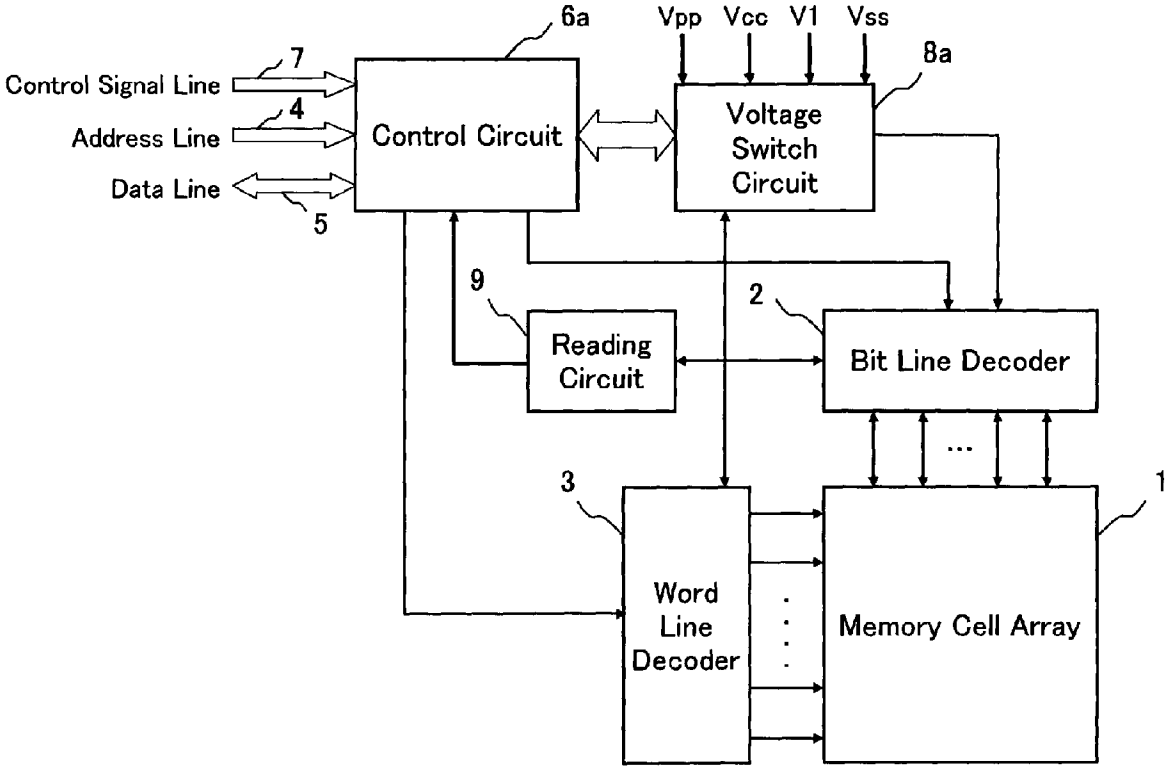
FIG. 1 is a block diagram showing one constitution example of a conventional nonvolatile semiconductor memory device comprising a memory cell array having 1R type memory cells.

1 Memory cell array
2 Bit line decoder
3 Word line decoder
4 Address line
5 Data line
6a, 6b, 6c, 6d, 6e, 6f, 6g Control circuit
7 Control signal line
8a, 8b, 8c, 8d, 8e, 8f, 8g Voltage switch circuit
9 Reading circuit
10 Memory cell, Variable resistance element
BL1 to BLm Bit line (column select line)
WL1 to WLn Word line (row select line)
Vcc Power supply voltage
Vss Ground voltage
Vpp Programming or erasing voltage
Va Programming, erasing or reading voltage
$V_{WE}$ Programming voltage, erasing voltage
$V_R$ Reading voltage
$V1_R$, $V2_R$, $V3_R$ First reading voltage
Te Erasing action period
Tr Reading action period
Tw Programming action period

BEST MODE FOR CARRYING OUT THE INVENTION

Embodiments of a nonvolatile semiconductor memory device and its operating method according to the present invention (referred to as the "device of the present invention" and "method of the present invention" occasionally hereinafter) will be described with reference to the drawings hereinafter.

According to this embodiment, a memory cell that constitutes a memory cell array of a nonvolatile semiconductor memory device comprises a variable resistance element in which a resistance value is reversibly changed by an electric pulse application and information is stored by the electric resistance change. As one example of the variable resistance element, a three-layer structure RRAM element in which Pt electrodes are provided so as to sandwich a PCMO film will be described. In addition, the present invention can be applied to any variable resistance element as long as its resistance is changed by the electric pulse application (or current application). Even when the variable resistance element is formed of a metal oxide other than the PCMO film, as long as its resistance is changed by the electric pulse application, the preset invention can be applied to it. In addition, when the variable resistance element is formed of a transition metal oxide and the resistance is changed by the electric pulse application, the present invention can be applied to it.

First Embodiment

First, a description will be made of a first embodiment in which a common unselect voltage $V_{WE}/2$ is applied to unselected word lines and unselected bit lines in each memory action of programming, erasing and reading in the device of the present invention, with reference to FIGS. 8 to 14.

Figure 8:
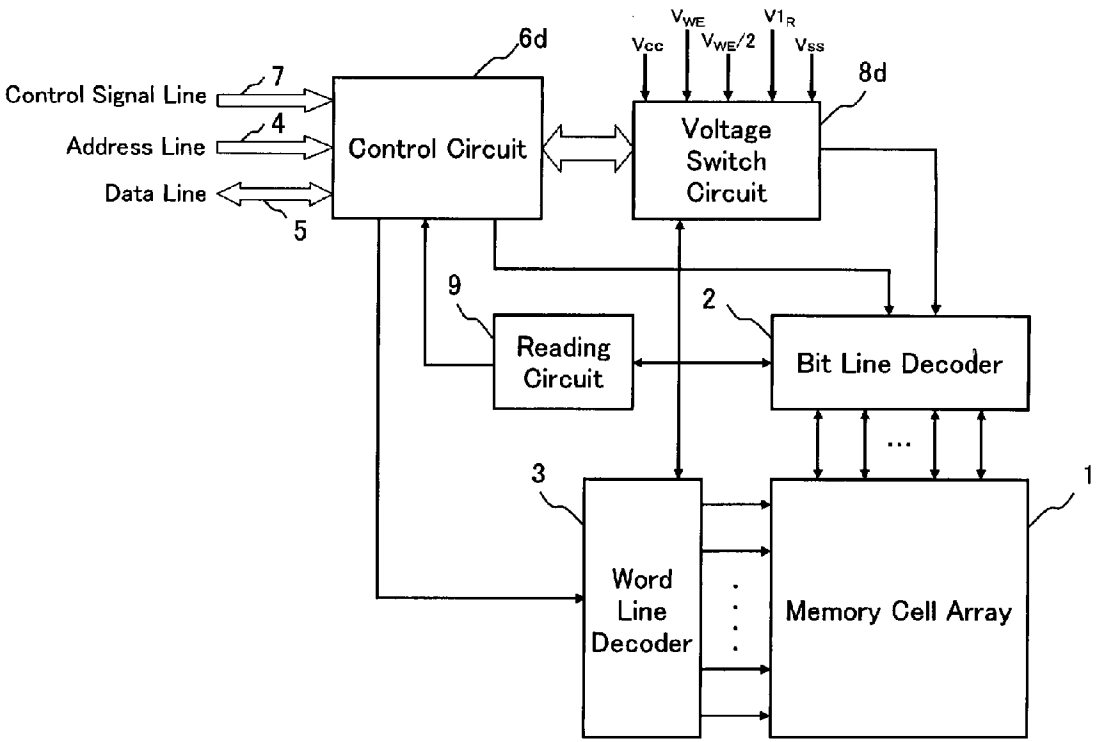
FIG. 8 is a block diagram showing a whole schematic constitution example in a first embodiment of a nonvolatile semiconductor memory device according to the present invention.
Figure 9:
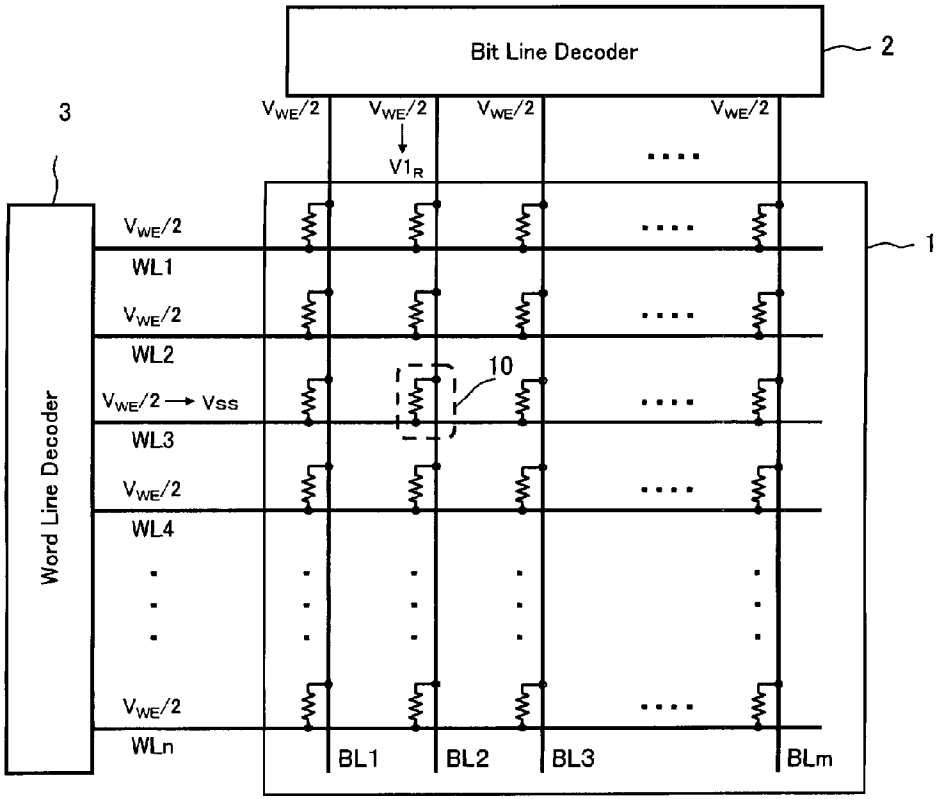
FIG. 9 is a circuit diagram showing an electric pulse applying process to each word line and each bit line at the time of programming action in the first embodiment of the nonvolatile semiconductor memory device according to the present invention.

FIG. 8 is a block diagram showing the functional constitution of the device of the present invention. In FIG. 8, a description will be made such that a common sign is allotted to a part common to that in the conventional nonvolatile semiconductor memory device. As shown in FIG. 8, the device of the present invention comprises a bit line decoder 2, a word line decoder 3, a voltage switch circuit 8d, a reading circuit 9, and a control circuit 6d around a memory cell array 1 comprising 1R type memory cells arranged like a matrix as shown in FIG. 9. Basically, the constitution is the same as that of the conventional nonvolatile semiconductor memory device shown in FIG. 1. It is different from the conventional nonvolatile semiconductor memory device shown in FIG. 1 in the voltages applied to each word line and each bit line of the memory cell array 1 from the voltage switch circuit 8d and the control action of the applied voltage by the control circuit 6d.

Figure 2:
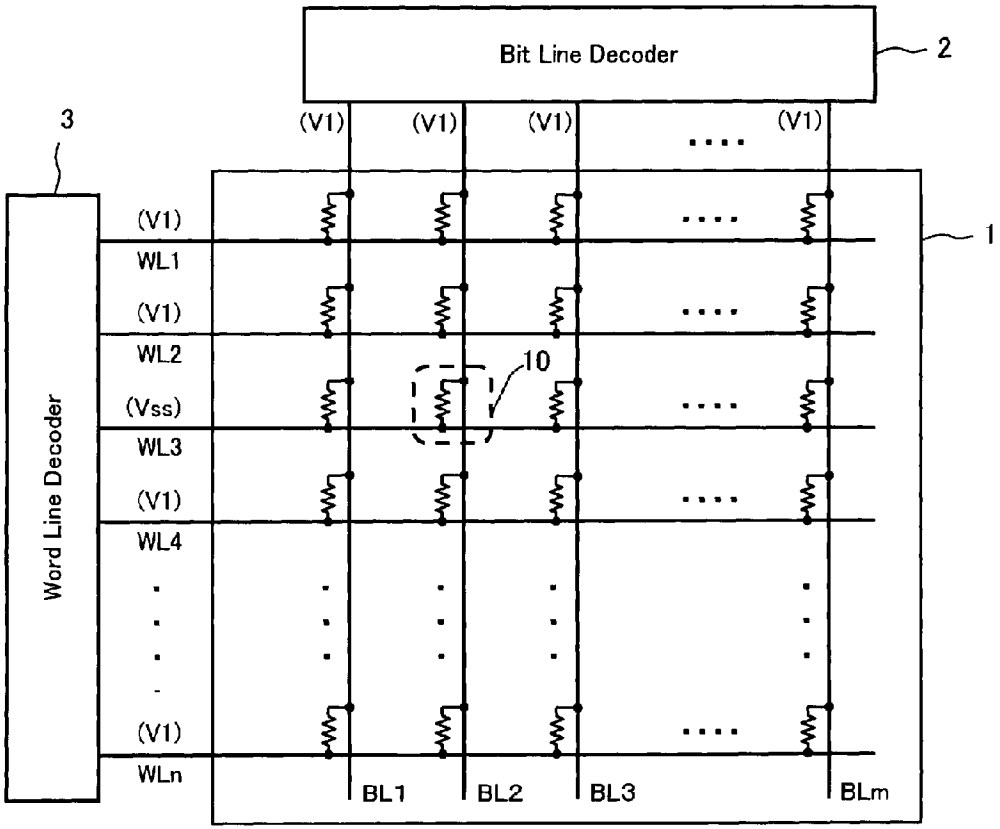
FIG. 2 is a circuit diagram schematically showing one constitution example of the memory cell array having the 1R type memory cells comprising only a variable resistance element.
Figure 3:
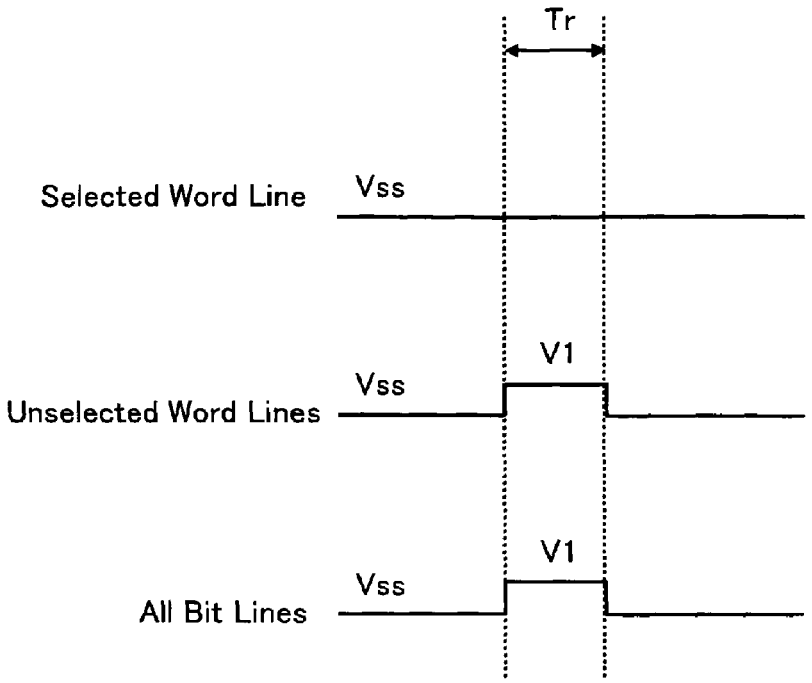
FIG. 3 is a timing chart showing a conventional example of an electric pulse applying process to each word line and each bit line at the time of reading action in the memory cell array having the 1R type memory cells.
Figure 4:
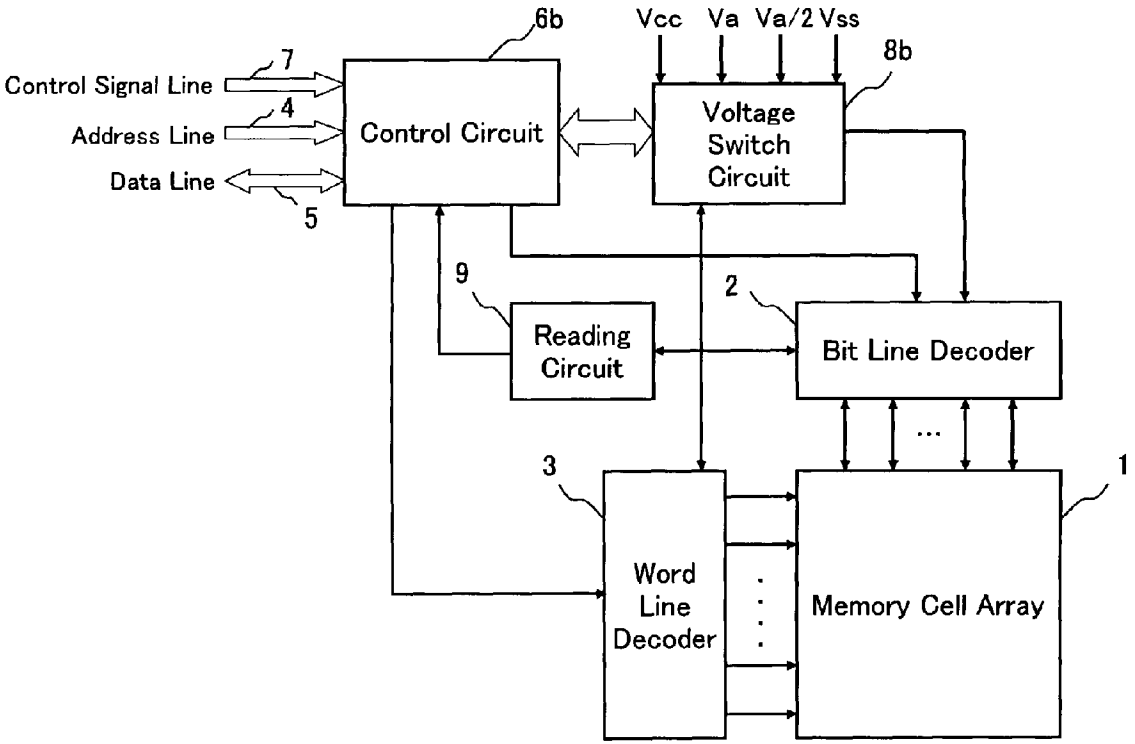
FIG. 4 is a block diagram showing another constitution example of a conventional nonvolatile semiconductor memory device comprising a memory cell array having 1R type memory cells.
Figure 5:
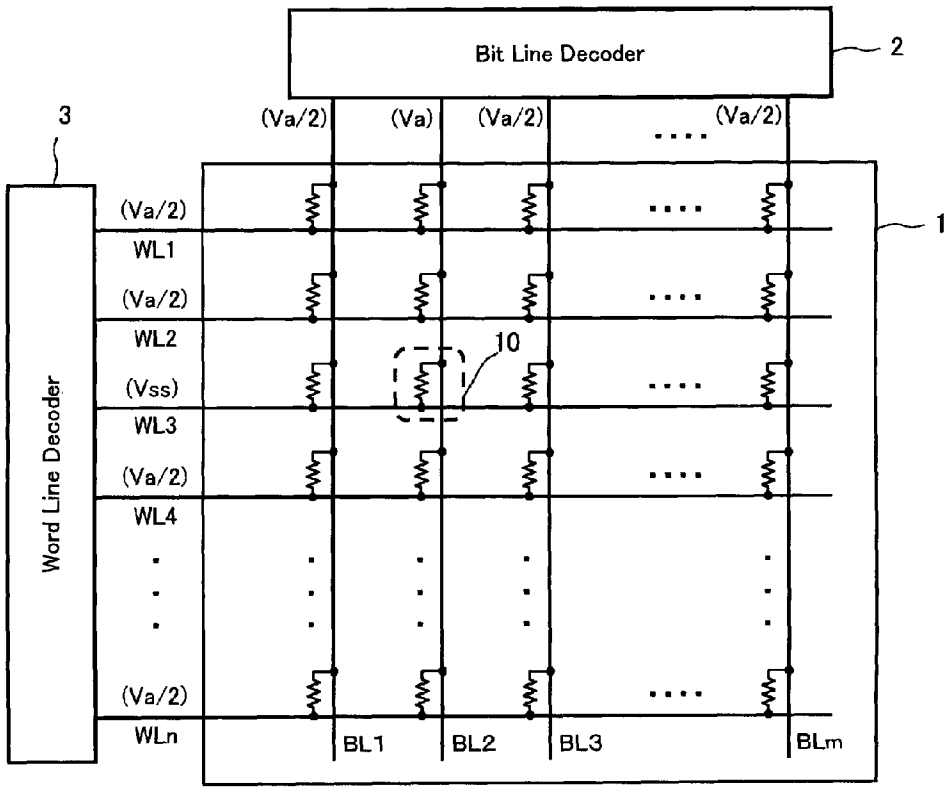
FIG. 5 is a circuit diagram showing one constitution example of a memory cell array having 1R type memory cells comprising a variable resistance element only and schematically showing a conventional example of an electric pulse applying process to each word line and each bit line at the time of each action of reading, programming and erasing.
Figure 6:
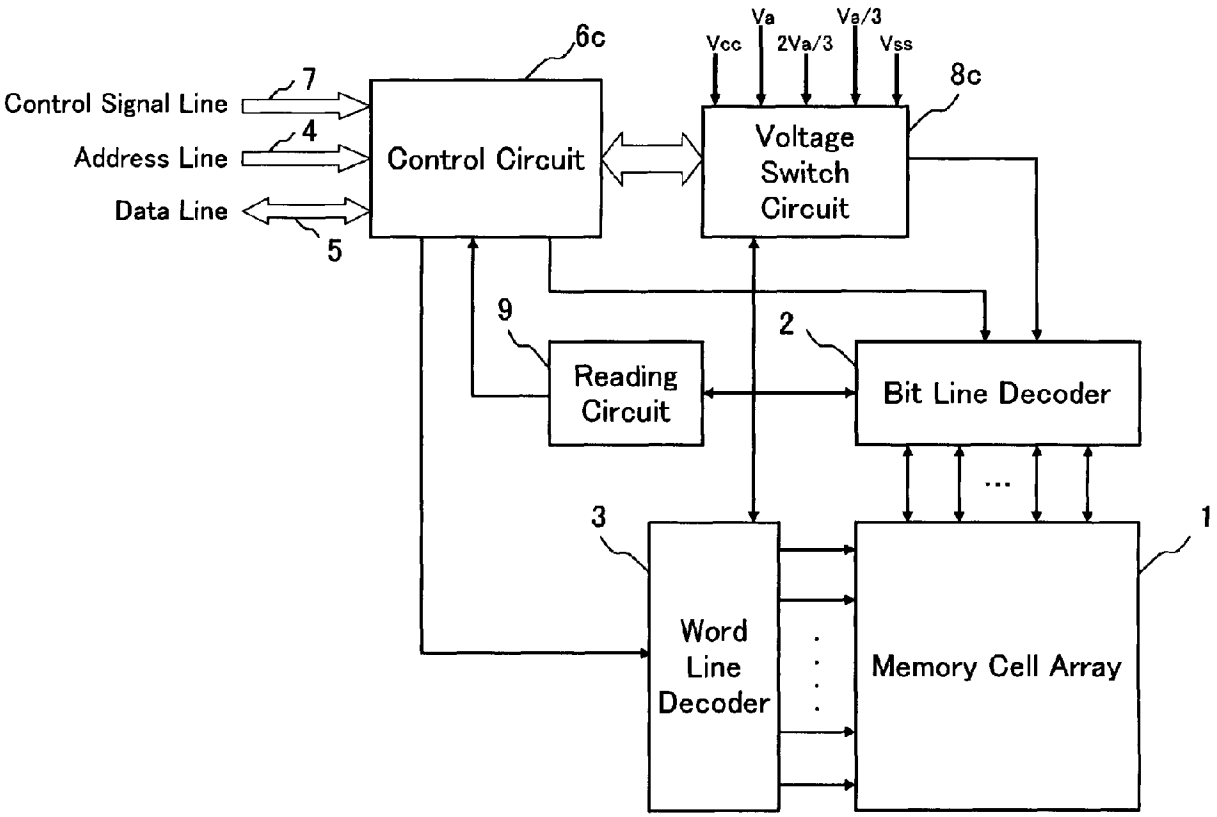
FIG. 6 is a block diagram showing another constitution example of a conventional nonvolatile semiconductor memory device comprising a memory cell array having 1R type memory cells.
Figure 7:
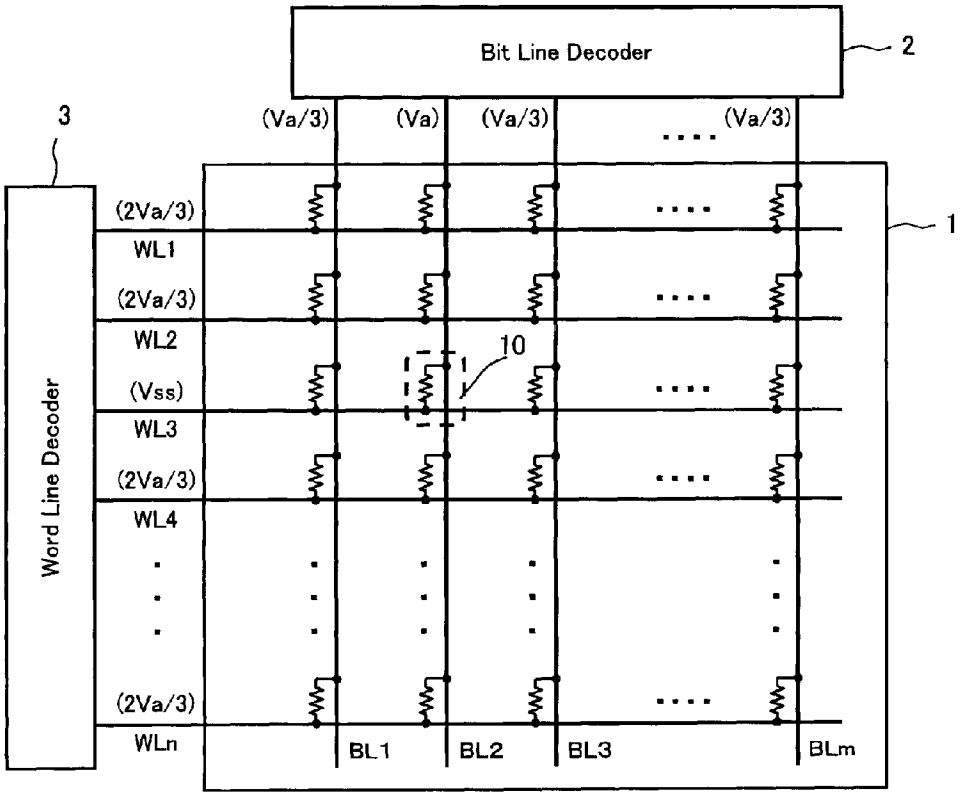
FIG. 7 is a circuit diagram showing one constitution example of a memory cell array having 1R type memory cells comprising a variable resistance element only and schematically showing a conventional example of an electric pulse applying process to each word line and each bit line at the time of each action of reading, programming and erasing.

The constitution of the memory cell array 1 is also the same as the memory cell array 1 of the conventional nonvolatile semiconductor memory device shown in FIG. 2. More specifically, the memory cell array 1 has a structure in which m×n memory cells 10 are positioned at intersections of m (BL1 to BLm) bit lines (corresponding to a column select lines) extending in a column direction and n (WL1 to WLn) word lines (corresponding to row select lines) extending in a row direction. In each memory cell 10, an upper electrode of the variable resistance element is connected to the word line and a lower electrode of the variable resistance element is connected to the bit line. In addition, it may be such that the lower electrode of the variable resistance element is connected to the word line and the upper electrode of the variable resistance element is connected to the bit line so that the relation between the upper electrode and the lower electrode of the variable resistance element is reversed.

Each of the bit line decoder 2 and the word line decoder 3 selects a memory cell to be read from the memory cell array 1 according to an address inputted from an address line 4 to the control circuit 6d. The word line decoder 3 selects the word line in the memory cell array 1 according to the signal inputted to the address line 4, and the bit line decoder 2 selects the bit line in the memory cell array 1 according to the address signal inputted to the address line 4. According to this embodiment, in the programming action and the erasing action, the bit line decoder 2 and the word line decoder 3 function as memory cell select circuits that select the memory cell from the memory cell array 1 by the memory cell, and in the reading action, the word line decoder 3 functions as a memory cell select circuit that selects the memory cell from the memory cell array 1 by the row.

The control circuit 6d controls each memory action of programming, erasing and reading of the memory cell array 1. The control circuit 6d controls the word line decoder 3, the bit line decoder 2, the voltage switch circuit 8d and the reading, programming and erasing actions of the memory cell array 1, based on the address signal inputted from the address line 4, a data input (at the time of programming) inputted from a data line 5, and a control input signal inputted from a control signal line 7. According to the example shown in FIG. 8, the control circuit 6d is provided with a function as a general address buffer circuit, data input/output buffer circuit, and control input buffer circuit though they are not shown.

The voltage switch circuit 8d switches each voltage of the word line and bit line required for the reading action, programming action and erasing action of the memory cell array 1 according to an action mode and supplies it to the memory cell array 1. According to this embodiment, in the reading action, the memory cells connected to one selected word line selected by the word line decoder 3 become the selected memory cells, and in the programming action and the erasing action, the memory cell connected to one selected word line selected by the word line decoder 3 and to one or more selected bit lines selected by the bit line decoder 2 becomes the selected memory cell, and according to each action mode of the programming, erasing and reading, a predetermined programming voltage $V_{WE}$, erasing voltage $V_{WE}$ or reading voltage $V_R$ is applied between the selected word line and the selected bit line. In the drawing, reference character Vcc designates a power supply voltage of the device of the present invention, reference character Vss designates the ground voltage, reference character $V_{WE}$ designates the program voltage and erasing voltage, reference character $V_{WE}/2$ designates the unselect voltage having a half voltage value of the programming voltage $V_{WE}$, reference character $V1_R$ designates a first reading voltage, which are supplied from the outside or generated in an internal circuit (not shown) and applied to the voltage switch circuit 8d and to predetermined word line and bit line. The first reading voltage $V1_R$ is used in generating the reading voltage $V_R$ required for data reading of the 1R type memory cell.

In addition, the programming voltage $V_{WE}$ is the voltage required for data programming of the 1R type memory cell, and the erasing voltage $V_{WE}$ is the voltage required for data erasing of the 1R type memory cell, which are the same voltage value in this embodiment and the same goes for the following description of the present invention.

The reading circuit 9 converts a reading current flowing in the bit line selected by the bit line decoder 2 among reading currents flowing in the bit line connected to the selected memory cell to a voltage, determines the state of memory data in the memory cell as a reading object connected to the selected bit line in the selected memory cells in one row, transfers its result to the control circuit 6d and outputs it to the data line 5.

Next, an electric pulse applying process for applying a predetermined voltage to each of the selected word line, selected bit line, unselected word lines and unselected bit lines in each of the programming action, the erasing action and reading action of the data in the memory cell array 1 according to this embodiment will be described with respect to each memory action.

Figure 10:
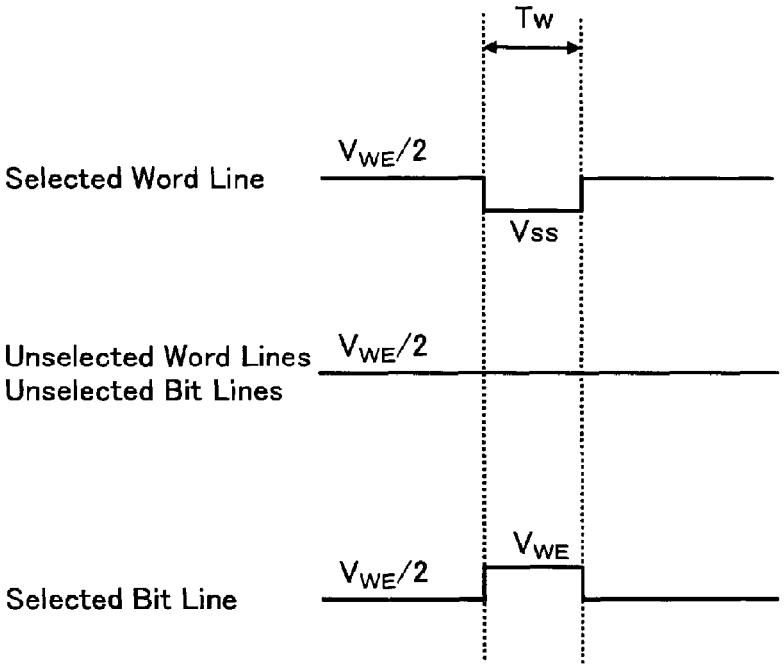
FIG. 10 is a timing chart showing the electric pulse applying process to each word line and each bit line at the time of programming action in the first embodiment of the nonvolatile semiconductor memory device according to the present invention.

FIGS. 9 and 10 show one example of the electric pulse applying process in the programming action. When data is programmed in the selected memory cell, the voltage of all the word lines and all the bit lines is previously set to the half of the programming voltage $V_{WE}$, that is, the unselect voltage $V_{WE}/2$ in a precharging time (action preparing time) just before the programming action is started. Alternatively, the voltage of all the word lines and all the bit lines may be set to the unselect voltage $V_{WE}/2$ in a standby time (that is neither the programming action, the erasing action nor reading action and a standby state under low power consumption).

During a programming action period Tw, the unselect voltage $V_{WE}/2$ that is the half of the programming voltage $V_{WE}$ is continuously applied to all the unselected word lines and all the unselected bit lines similar to during the precharge period, and the ground voltage Vss (corresponding to a second programming voltage) to the selected word line and the programming voltage $V_{WE}$ (corresponding to a first programming voltage) is applied to the selected bit line. During the programming action period Tw, since a voltage deference of the programming voltage $V_{WE}$ is generated between the selected bit line and the selected word line, the programming voltage $V_{WE}$ is applied to the variable resistance element in the selected memory cell and data can be programmed. At this time, although the unselect voltage $V_{WE}/2$ that is the half of the programming voltage $V_{WE}$ is applied to the memory cell connected to the selected word line and the unselected bit lines and the memory cell connected to the selected bit line and the unselected word lines, since the voltage is sufficiently lower than the programming voltage $V_{WE}$, programming is not performed.

Figure 11:
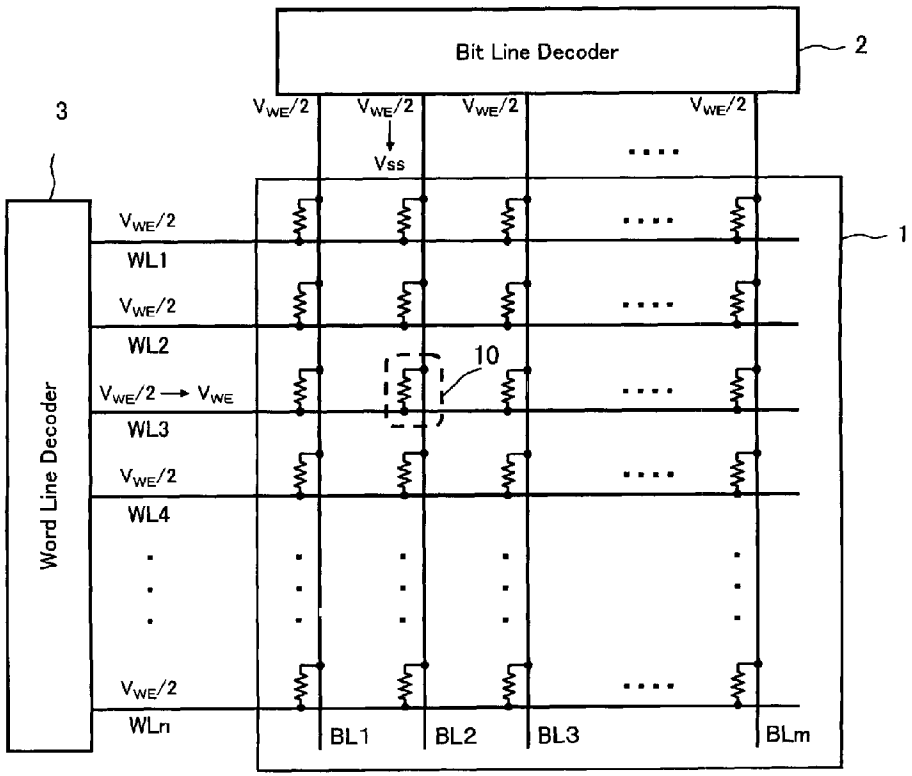
FIG. 11 is a circuit diagram showing an electric pulse applying process to each word line and each bit line at the time of erasing action in the first embodiment of the nonvolatile semiconductor memory device according to the present invention.
Figure 12:
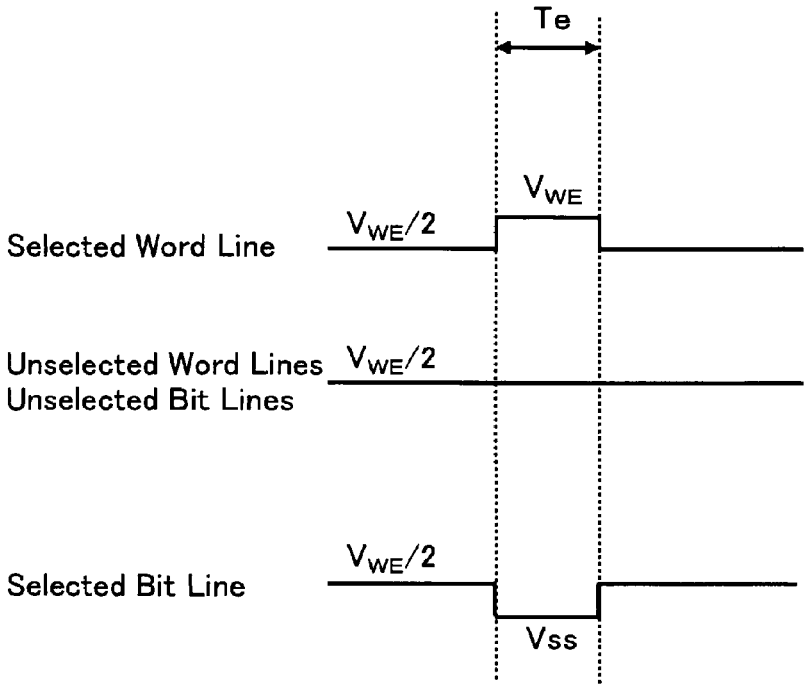
FIG. 12 is a timing chart showing the electric pulse applying process to each word line and each bit line at the time of erasing action in the first embodiment of the nonvolatile semiconductor memory device according to the present invention.

FIGS. 11 and 12 show one example of the electric pulse applying process at the time of the erasing action. When the data of the selected memory cell is erased, the voltage of all the word lines and all the bit lines is previously set to the half of the erasing voltage $V_{WE}$, that is, the unselect voltage $V_{WE}/2$ in a precharging period (action preparing period) just before the erasing action is started. Alternatively, the voltage of all the word lines and all the bit lines may be set to the unselect voltage $V_{WE}/2$ in a standby time of the device of the present invention.

During an erasing action period Te, the half unselect voltage $V_{WE}/2$ of the erasing voltage $V_{WE}$ is continuously applied to all the unselected word lines and all the unselected bit lines similar to during the precharging period, and the erasing voltage $V_{WE}$ (corresponding to a first erasing voltage) is applied to the selected word line and the ground voltage Vss (corresponding to a second erasing voltage) is applied to the selected bit line. During the erasing action period Te, since a voltage deference of the erasing voltage $V_{WE}$ that is the same as the programming voltage $V_{WE}$ but has the opposite polarity is generated between the selected word line and the selected bit line, the erasing voltage $V_{WE}$ is applied to the variable resistance element in the selected memory cell and data can be erased. At this time, although the unselect voltage $V_{WE}/2$ that is the half of the erasing voltage $V_{WE}$ is applied to the memory cell connected to the selected word line and unselected bit lines and the memory cell connected to the selected bit line and unselected word lines, since the voltage is sufficiently lower than the erasing voltage $V_{WE}$, erasing is not performed.

Figure 13:
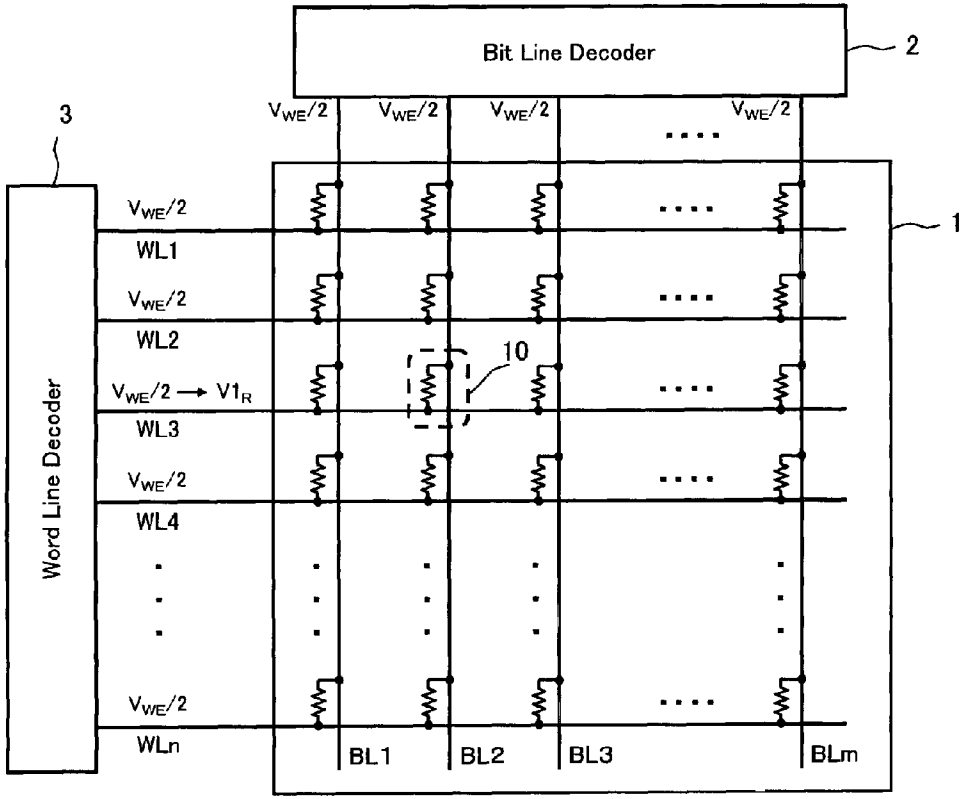
FIG. 13 is a circuit diagram showing an electric pulse applying process to each word line and each bit line at the time of reading action in the first embodiment of the nonvolatile semiconductor memory device according to the present invention.
Figure 14:
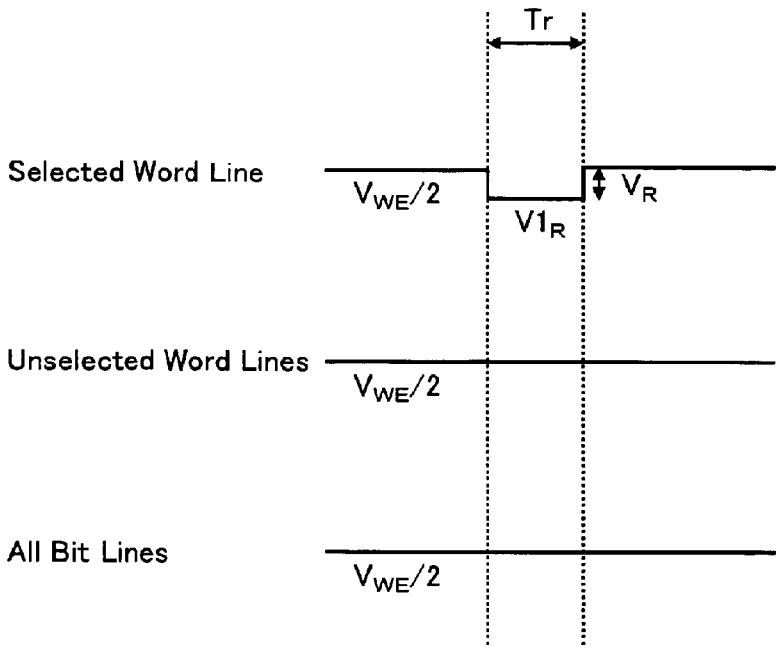
FIG. 14 is a timing chart showing the electric pulse applying process to each word line and each bit line at the time of reading action in the first embodiment of the nonvolatile semiconductor memory device according to the present invention.

FIGS. 13 and 14 show one example of the electric pulse applying process at the time of the reading action. When the data of the selected memory cell is read, the voltage of all the word lines and all the bit lines is previously set to the half of the programming voltage $V_{WE}$, that is, unselect voltage $V_{WE}/2$ in a precharging period (action preparing period) just before the reading action is started. Alternatively, the voltage of all the word lines and all the bit lines may be set to the unselect voltage $V_{WE}/2$ in a standby time of the device of the present invention.

During a reading action period Tr, the half unselect voltage $V_{WE}/2$ of the programming voltage $V_{WE}$ is continuously applied to all the unselected word lines and all the unselected bit lines and the selected bit line, and the first reading voltage $V1_R$ is applied to the selected word line. Here, the first reading voltage $V1_R$ is set to the voltage difference ($V1_R - V_{WE}/2 - V_R$) between the unselect voltage $V_{WE}/2$ and the reading voltage $V_R$. As a result, since the voltage deference of the reading voltage $V_R$ is generated between the selected bit line and the selected word line during the reading action period Tr, the reading voltage $V_R$ can be applied to the variable resistance element of the selected memory cell, so that the state of the resistance of the variable resistance element can be read. The reading voltage $V_R$ is below the programming voltage $V_{WE}$ and it only has to be enough for the reading circuit 9 to read the data. The reading voltage $V_R$ can be the unselect voltage $V_{WE}/2$ that is the half of the programming voltage $V_{WE}$ by adjusting the material, composition, film thickness, area and the like of the variable resistance element. In this case, since the first reading voltage $V1_R$ is equal to the ground voltage Vss, the number of kinds of the voltages supplied to the voltage switch circuit 8d can be reduced.

As described above, since the common unselect voltage $V_{WE}/2$ is applied to the unselected word lines and the unselected bit lines during each memory action of programming, erasing, and reading and during the precharging period of each action, in the case of moving to the different memory action during a certain memory action or a case of moving to a certain memory action from a certain precharging period, each memory action can be performed only by changing the voltages of the selected word line and the selected bit line. Thus, the current consumption generated by a transient current accompanied by charging and discharging of parasitic capacity, to set each word line and each bit line at a predetermined voltage during each memory action can be considerably reduced.

Second Embodiment

Next, a description will be made of a second embodiment in which the ground voltage Vss is applied as the common unselect voltage, to unselected word lines and unselected bit lines in each memory action of programming, erasing and reading in the device of the present invention, with reference to FIGS. 15 to 21.

Figure 15:
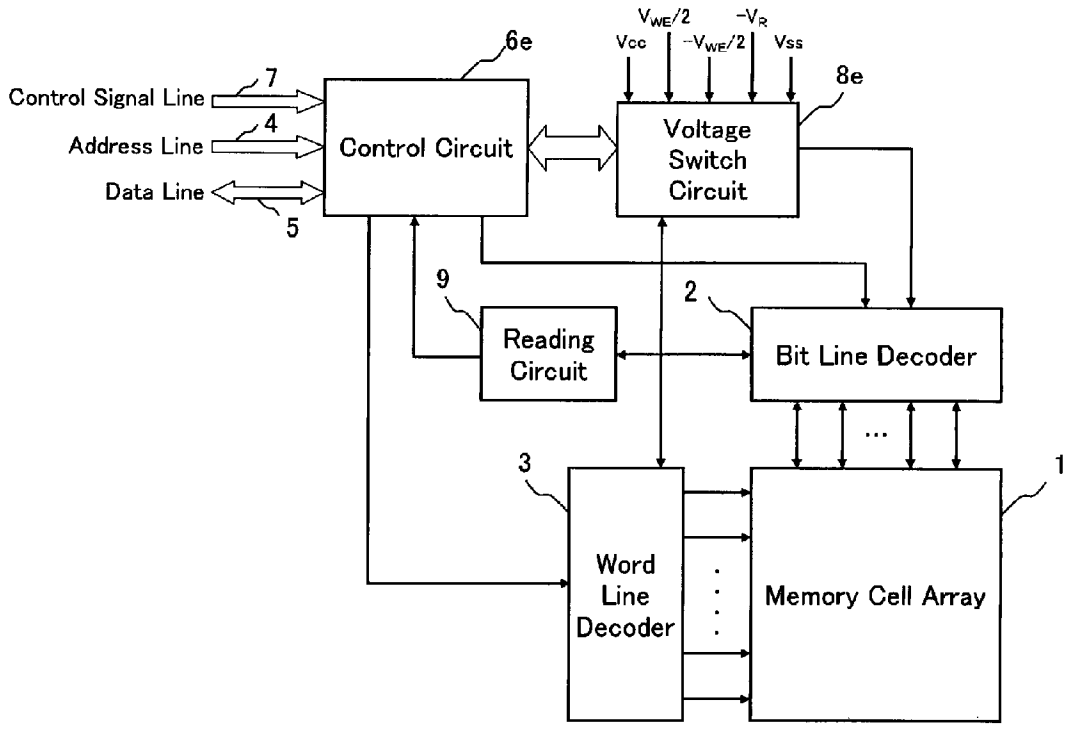
FIG. 15 is a block diagram showing a whole schematic constitution example in a second embodiment of a nonvolatile semiconductor memory device according to the present invention.
Figure 16:
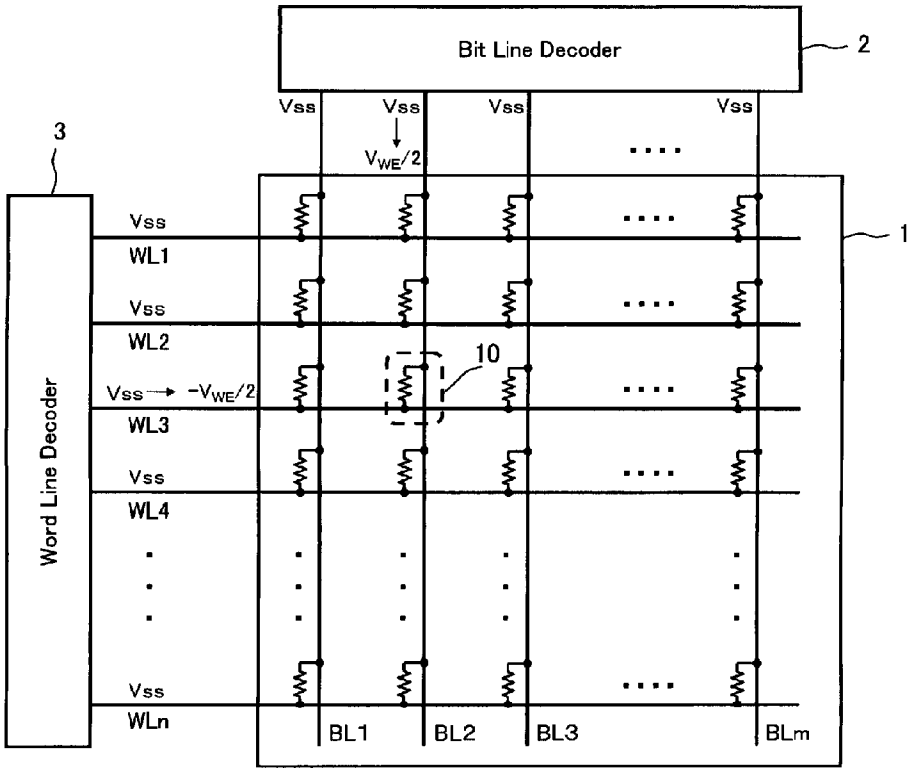
FIG. 16 is a circuit diagram showing an electric pulse applying process to each word line and each bit line at the time of programming action in the second embodiment of the nonvolatile semiconductor memory device according to the present invention.

FIG. 15 is a block diagram showing the functional constitution of a device of the present invention according to the second embodiment. In FIG. 15, a description will be made such that a common sign is allotted to a part common to that in the conventional nonvolatile semiconductor memory device and the first embodiment. As shown in FIG. 15, the device of the present invention comprises a bit line decoder 2, a word line decoder 3, a voltage switch circuit 8e, a reading circuit 9, and a control circuit 6e around a memory cell array 1 in which 1R type memory cells are arranged like a matrix as shown in FIG. 16. Basically, the constitution is the same as that of the conventional nonvolatile semiconductor memory device shown in FIG. 1 and the first embodiment in FIG. 8. It is different from the first embodiment in the voltages applied to each word line and each bit line of the memory cell array 1 from the voltage switch circuit 8e and the control action of the applied voltage by the control circuit 6e. The constitution of the memory cell array 1 is also the same as the memory cell arrays 1 of the conventional nonvolatile semiconductor memory device shown in FIG. 2 and of the first embodiment shown in FIG. 9.

The description will not be made of the same component in the first embodiment but will be made of the voltage switch circuit 8e and the control circuit 6e.

The control circuit 6e controls each memory action of programming, erasing and reading of the memory cell array 1 similar to the first embodiment. Although the basic control action is the same as that of the first embodiment, it is different from the first embodiment in that among the voltages supplied from the voltage switch circuit 8e, the ground voltage Vss is applied to the unselected word lines and the unselected bit lines as the unselect voltage. The control circuit 6e controls the word line decoder 3, the bit line decoder 2, the voltage switch circuit 8e and the reading, programming and erasing actions of the memory cell array 1, based on an address signal inputted from an address line 4, a data input (at the time of programming) inputted from a data line 5, and a control input signal inputted from a control signal line 7. In the example shown in FIG. 15, the control circuit 6e is provided with a function as a general address buffer circuit, data input/output buffer circuit, control input buffer circuit though they are not shown.

The voltage switch circuit 8e switches each voltage of the word line and bit line required for the reading action, programming action and erasing action of the memory cell array 1 according to an action mode and supplies it to the memory cell array 1. Similar to the first embodiment, in the reading action, the memory cells connected to one selected word line selected by the word line decoder 3 become the selected memory cells, and in the programming action and the erasing action, the memory cell connected to one selected word line selected by the word line decoder 3 and to one or more selected bit lines selected by the bit line decoder 2 becomes the selected memory cell, and according to each action mode of the programming, erasing and reading, a predetermined programming voltage $V_{WE}$, erasing voltage $V_{WE}$ or reading voltage $V_R$ is applied between the selected word line and the selected bit line. In the drawing, reference character Vcc designates a power supply voltage of the device of the present invention, reference character Vss designates the ground voltage and the unselect voltage, reference character $V_{WE}/2$ designates a first programming voltage and a first erasing voltage, reference character $-V_{WE}/2$ designates a second programming voltage and a second erasing voltage, and reference character $-V_R$ designates a first reading voltage, which are supplied from the outside or generated in an internal circuit (not shown) and applied to the voltage switch circuit 8e and to a certain word line and bit line.

Next, an electric pulse applying process for applying a predetermined voltage to each of the selected word line, selected bit line, unselected word lines and unselected bit lines in each of the programming action, the erasing action and reading action of the data in the memory cell array 1 according to the second embodiment will be described with respect to each memory action.

Figure 17:
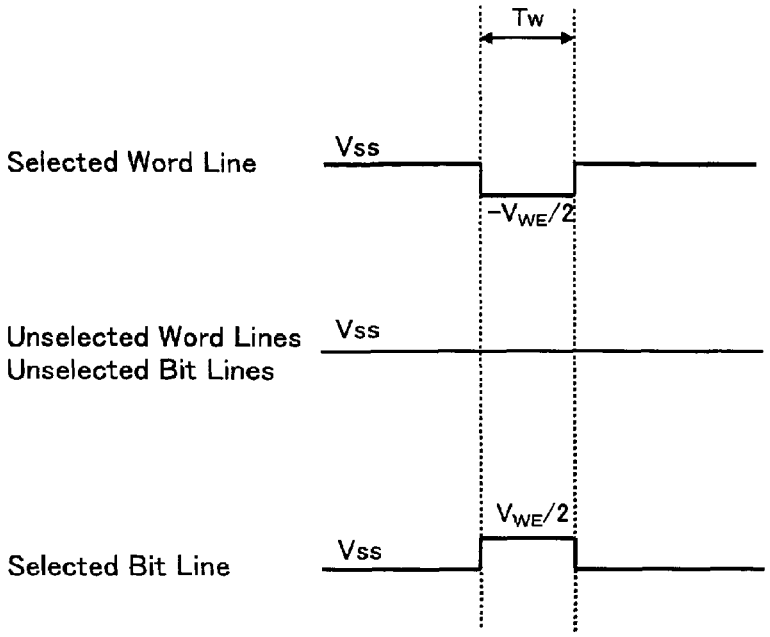
FIG. 17 is a timing chart showing the electric pulse applying process to each word line and each bit line at the time of programming action in the second embodiment of the nonvolatile semiconductor memory device according to the present invention.

FIGS. 16 and 17 show one example of the electric pulse applying process in the programming action. When data is programmed in the selected memory cell, the voltage of all the word lines and all the bit lines is previously set to the unselect voltage, that is, the ground voltage Vss in a precharging period (action preparing time) just before the programming action is started. Alternatively, the voltage of all the word lines and all the bit lines may be set to the unselect voltage Vss in a standby time of the device of the present invention.

During a programming action period Tw, the unselect voltage Vss is continuously applied to all unselected word lines and all unselected bit lines similar to during the precharging period, and the first programming voltage $V_{WE}/2$ that is the half of the programming voltage $V_{WE}$ is applied to the selected bit line and the second programming voltage $-V_{WE}/2$ that is the half of the programming voltage $V_{WE}$ and has negative polarity is applied to the selected word line. During the programming action period Tw, since a voltage deference of the programming voltage $V_{WE}$ is generated between the selected bit line and the selected word line, the programming voltage $V_{WE}$ is applied to the variable resistance element in the selected memory cell and data can be programmed. At this time, although the first programming voltage $V_{WE}/2$ is applied to the memory cell connected to the selected word line and unselected bit lines and the memory cell connected to the selected bit line and unselected word lines, since the voltage is sufficiently lower than the programming voltage $V_{WE}$, programming is not performed.

Figure 18:
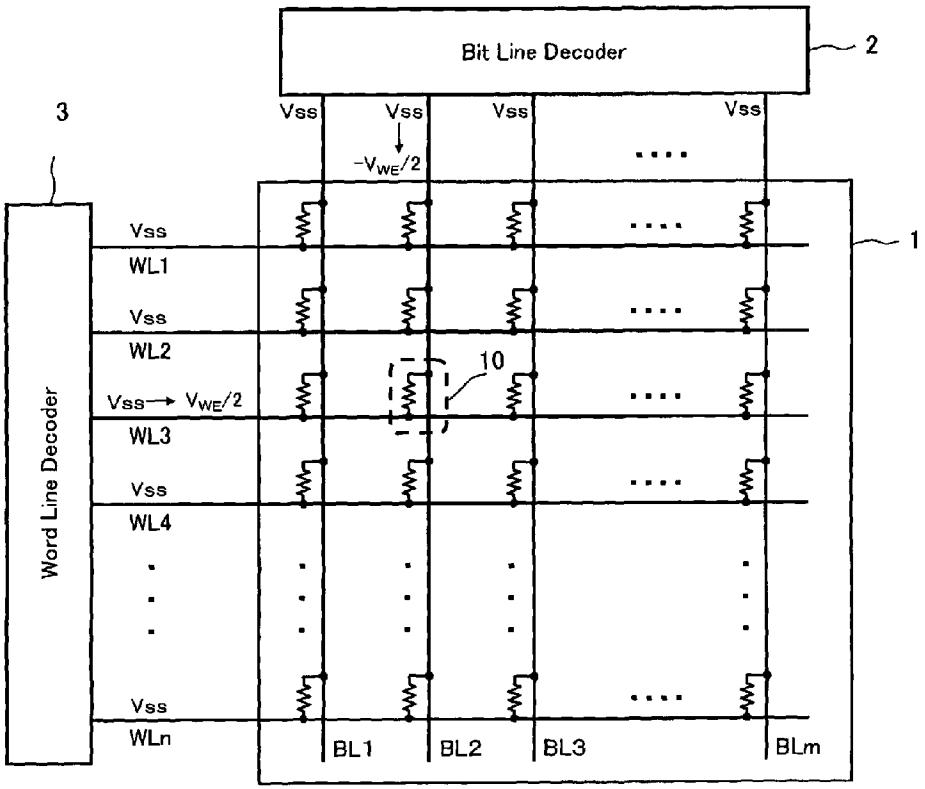
FIG. 18 is a circuit diagram showing an electric pulse applying process to each word line and each bit line at the time of erasing action in the second embodiment of the nonvolatile semiconductor memory device according to the present invention.
Figure 19:
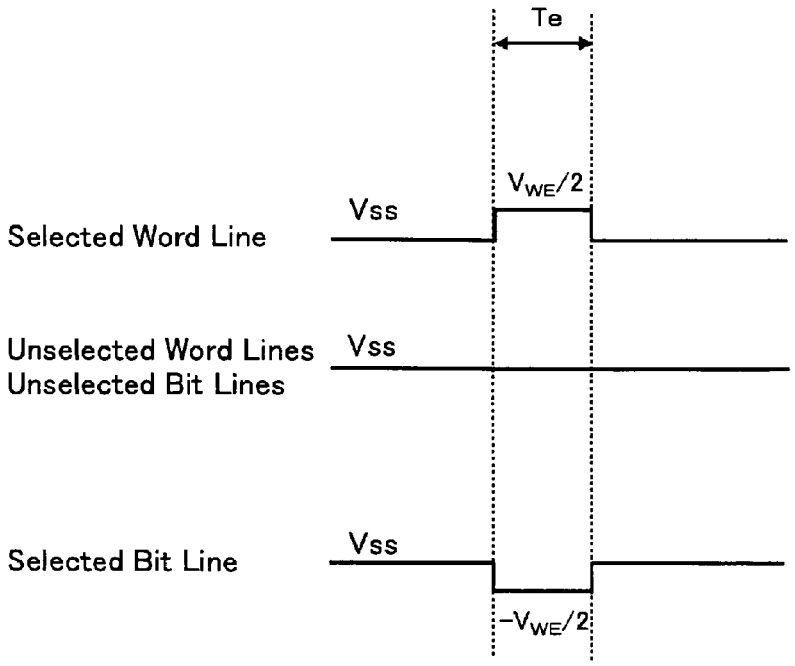
FIG. 19 is a timing chart showing the electric pulse applying process to each word line and each bit line at the time of erasing action in the second embodiment of the nonvolatile semiconductor memory device according to the present invention.

FIGS. 18 and 19 show one example of the electric pulse applying process at the time of the erasing action. When the data of the selected memory cell is erased, the voltage of all the word lines and all the bit lines is previously set to the ground voltage Vss that is the unselect voltage in a precharging period (action preparing period) just before the erasing action is started. Alternatively, the voltage of all the word lines and all the bit lines may be set to the unselect voltage Vss in a standby time of the device of the present invention.

During an erasing action period Te, the unselect voltage Vss is continuously applied to all unselected word lines and all unselected bit lines similar to during the precharging period, and the first erasing voltage $V_{WE}/2$ that is the half of the erasing voltage $V_{WE}$ is applied to the selected word line and the second erasing voltage $-V_{WE}/2$ that is the half of the erasing voltage $V_{WE}$ and has a negative polarity is applied to the selected bit line. During the erasing action period Te, since the voltage deference of the erasing voltage $V_{WE}$ that is equal to the programming voltage $V_{WE}$ but has the opposite polarity is generated between the selected word line and the selected bit line, the erasing voltage $V_{WE}$ is applied to the variable resistance element in the selected memory cell and data can be erased. At this time, although the first erasing voltage $V_{WE}/2$ is applied to the memory cell connected to the selected word line and unselected bit lines and the memory cell connected to the selected bit line and unselected word lines, since the voltage is sufficiently lower than the erasing voltage $V_{WE}$, erasing is not performed.

Figure 20:
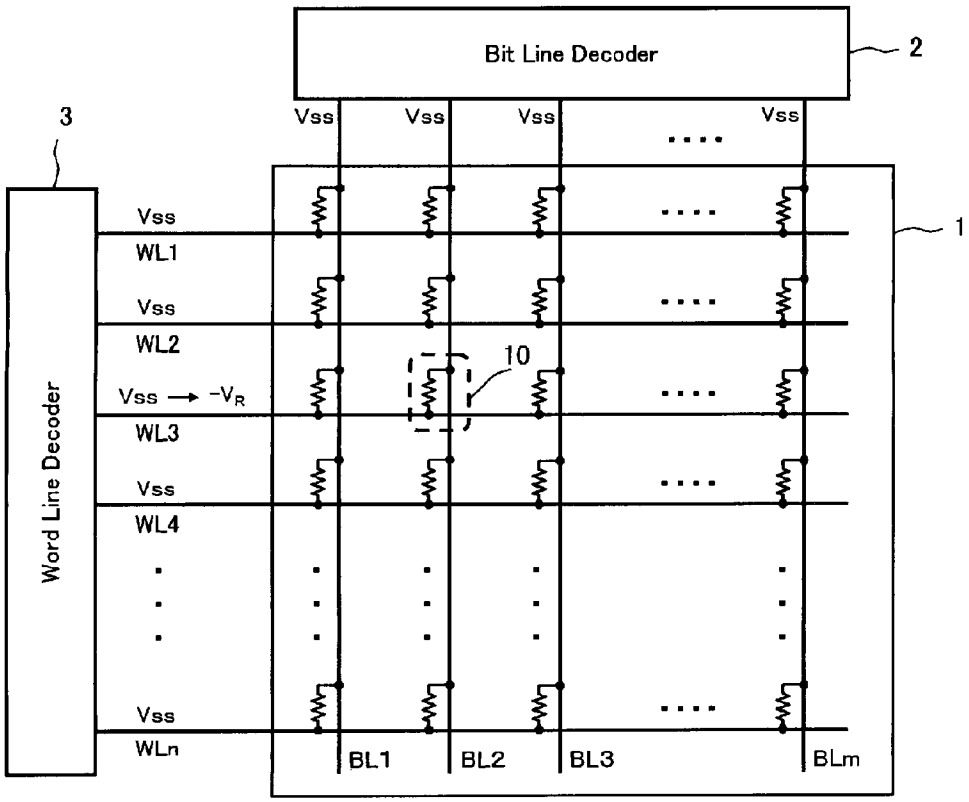
FIG. 20 is a circuit diagram showing an electric pulse applying process to each word line and each bit line at the time of reading action in the second embodiment of the nonvolatile semiconductor memory device according to the present invention.
Figure 21:
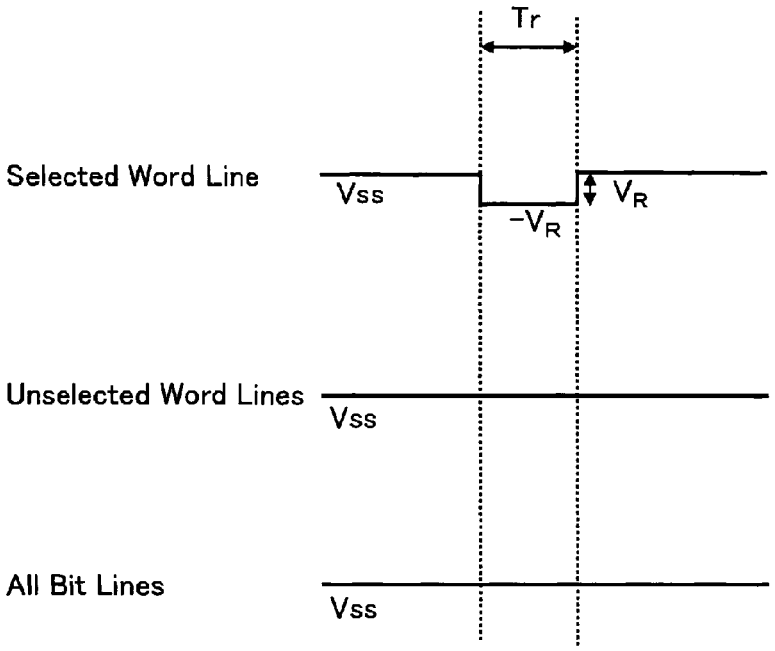
FIG. 21 is a timing chart showing the electric pulse applying process to each word line and each bit line at the time of reading action in the second embodiment of the nonvolatile semiconductor memory device according to the present invention.

FIGS. 20 and 21 show one example of the electric pulse applying process at the time of the reading action. When the data of the selected memory cell is read, the voltage of all the word lines and all the bit lines is previously set to the unselect voltage that is the ground voltage Vss in a precharging period (action preparing period) just before the reading action is started. Alternatively, the voltage of all the word lines and all the bit lines may be set to the unselect voltage Vss in a standby time of the device of the present invention.

During a reading action period Tr, the unselect voltage Vss is applied to all the unselected word lines and all the unselected bit lines and the selected bit line, and the first reading voltage $-V_R$ is applied to the selected word line. Here, the first reading voltage $-V_R$ is set to the voltage difference ($-V_R$−Vss−$V_R$) between the unselect voltage Vss and the reading voltage $V_R$, that is, set to the voltage that is equal to the reading voltage $V_R$ but opposite in polarity. As a result, since the voltage deference of the reading voltage $V_R$ is generated between the selected bit line and the selected word line during the reading action period Tr, the reading voltage $V_R$ can be applied to the variable resistance element of the selected memory cell, and the state of the resistance of the variable resistance element can be read. The reading voltage $V_R$ is below the programming voltage $V_{WE}$ and it only has to be enough for the reading circuit 9 to read the data. The reading voltage $V_R$ can be the first programming voltage $V_{WE}/2$ that is the half of the programming voltage $V_{WE}$ by adjusting the material, composition, film thickness, area and the like of the variable resistance element. In this case, since the first reading voltage $-V_R$ is equal to the second programming voltage $-V_{WE}/2$, the number of kinds of the voltages supplied to the voltage switch 8e can be reduced.

As described above, since the common unselect voltage Vss is applied to the unselected word lines and the unselected bit lines during each memory action of programming, erasing, and reading and during the precharging period, in the case of moving to the different memory action during a certain memory action or a case of moving to a certain memory action from a certain precharging period, each memory action can be performed only by changing the voltages of the selected word line and the selected bit line. Thus, the current consumption generated by the transient current accompanied by charging and discharging of the parasitic capacity, to set each word line and each bit line at a predetermined voltage during each memory action can be considerably reduced. In addition, since the absolute value of the maximum voltage applied to the word line and the bit line in each action mode is $V_{WE}/2$, that is the half of the programming voltage $V_{WE}$ and the erasing voltage $V_{WE}$, or the reading voltage $V_R$, the voltage used in the device of the present invention is reduced, so that the current consumption is further reduced.

Third Embodiment

Next, a description will be made of a third embodiment in which a common first unselect voltage $V_{WE}/3$ that is one third of the programming voltage $V_{WE}$ is applied to the unselected word lines and the unselected bit lines in each memory action of programming, erasing and reading in the device of the present invention, with reference to FIGS. 22 to 28.

Figure 22:
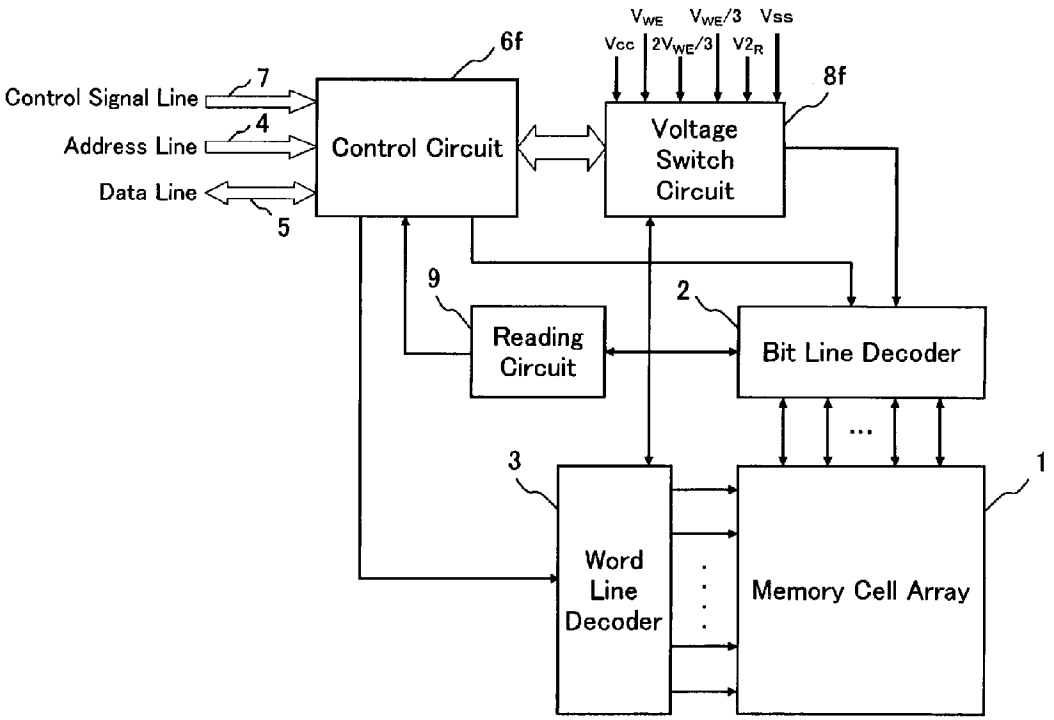
FIG. 22 is a block diagram showing a whole schematic constitution example in a third embodiment of a nonvolatile semiconductor memory device according to the present invention.
Figure 23:
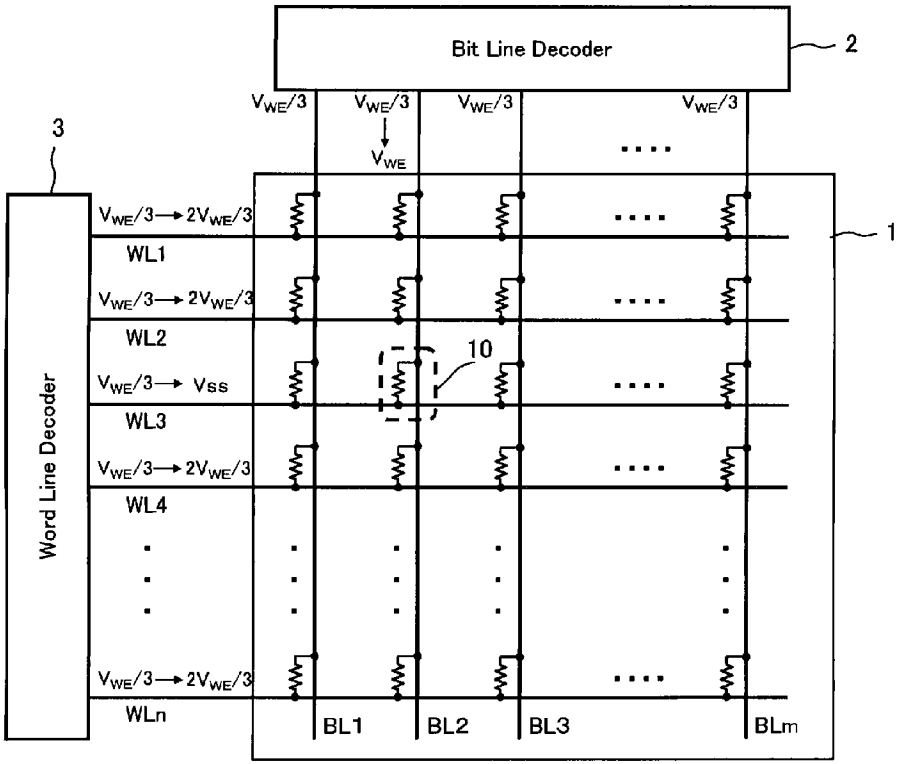
FIG. 23 is a circuit diagram showing an electric pulse applying process to each word line and each bit line at the time of programming action in the third embodiment of the nonvolatile semiconductor memory device according to the present invention.

FIG. 22 is a block diagram showing the functional constitution of the device of the present invention according to the third embodiment. In FIG. 22, a description will be made such that a common sign is allotted to a part common to that in the conventional nonvolatile semiconductor memory device and the first embodiment. As shown in FIG. 22, the device of the present invention comprises a bit line decoder 2, a word line decoder 3, a voltage switch circuit 8f, a reading circuit 9, and a control circuit 6f around a memory cell array 1 in which 1R type memory cells are arranged like a matrix as shown in FIG. 23. Basically, the constitution is the same as that of the conventional nonvolatile semiconductor memory device shown in FIG. 1 and the first embodiment in FIG. 8. It is different from the first embodiment in the voltages applied to each word line and each bit line of the memory cell array 1 from the voltage switch circuit 8f and the control action of the applied voltage by the control circuit 6f. The constitution of the memory cell array 1 is also the same as the memory cell arrays 1 of the conventional nonvolatile semiconductor memory device shown in FIG. 2 and of the first embodiment shown in FIG. 9.

The description will not be made of the same component as that in the first embodiment but will be made of the voltage switch circuit 8f and the control circuit 6f.

The control circuit 6f controls each memory action of programming, erasing and reading of the memory cell array 1 similar to the first embodiment. Although the basic control action is the same as that of the first embodiment, it is different from the first embodiment in that among the voltages supplied from the voltage switch circuit 8f, the voltage $V_{WE}/3$ that is one third of the programming voltage $V_{WE}$ as a first unselect voltage and the voltage $2V_{WE}/3$ that is two thirds of the programming voltage $V_{WE}$ as a second unselect voltage are applied to the unselected word lines and the unselected bit lines. The control circuit 6f controls the word line decoder 3, the bit line decoder 2, the voltage switch circuit 8f and the reading, programming and erasing actions of the memory cell array 1, based on an address signal inputted from an address line 4, a data input (at the time of programming) inputted from a data line 5, and a control input signal inputted from a control signal line 7. In the example shown in FIG. 22, the control circuit 6f is provided with a function as a general address buffer circuit, data input/output buffer circuit, and control input buffer circuit though they are not shown.

The voltage switch circuit 8f switches each voltage of the word line and the bit line required for the reading action, programming action and erasing action of the memory cell array 1 according to an action mode and supplies it to the memory cell array 1. Similar to the first embodiment, in the reading action, the memory cells connected to one selected word line selected by the word line decoder 3 become the selected memory cells, and in the programming action and the erasing action, the memory cell connected to one selected word line selected by the word line decoder 3 and to one or more selected bit lines selected by the bit line decoder 2 becomes the selected memory cell, and according to each action mode of the programming, erasing and reading, a predetermined programming voltage $V_{WE}$, erasing voltage $V_{WE}$ or reading voltage $V_R$ is applied between the selected word line and the selected bit line. In the drawing, reference character Vcc designates a power supply voltage of the device of the present invention, reference character Vss designates the ground voltage, reference character $V_{WE}$ designates a programming voltage and an erasing voltage, reference character $V_{WE}/3$ designates a first unselect voltage, reference character $2V_{WE}/3$ designates a second unselect voltage, and reference character $V2_R$ designates a first reading voltage, which are supplied from the outside or generated in an internal circuit (not shown) and applied to the voltage switch circuit 8f and to a certain word line and bit line. The first reading voltage $V2_R$ is used in generating the reading voltage $V_R$ required for reading the data of the 1R type memory cell.

Next, an electric pulse applying process for applying a predetermined voltage to each of the selected word line, selected bit line, unselected word lines and unselected bit lines in each of the programming action, the erasing action and reading action of the data in the memory cell array 1 according to the third embodiment will be described with respect to each memory action.

Figure 24:
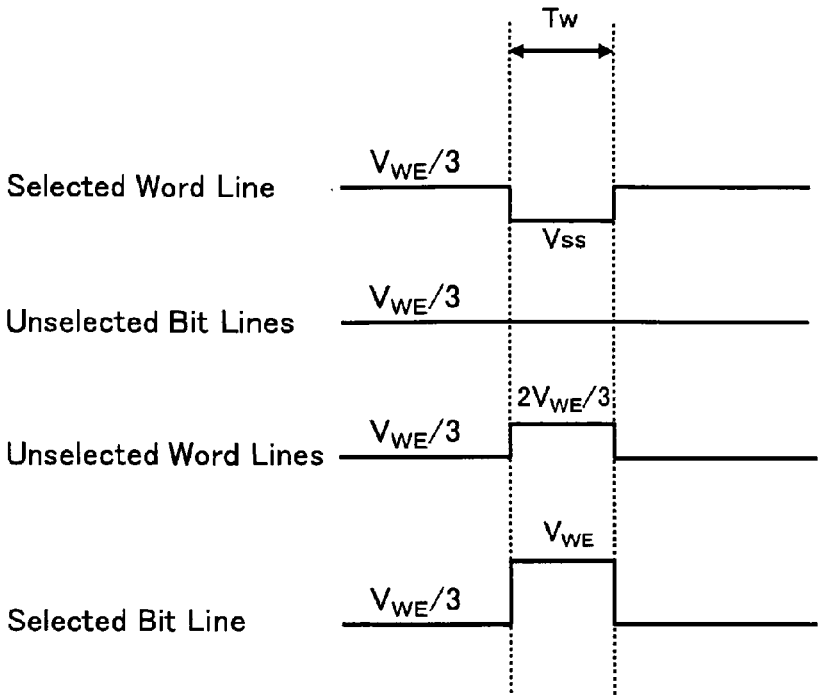
FIG. 24 is a timing chart showing the electric pulse applying process to each word line and each bit line at the time of programming action in the third embodiment of the nonvolatile semiconductor memory device according to the present invention.

FIGS. 23 and 24 show one example of the electric pulse applying process in the programming action. When data is programmed in the selected memory cell, the voltage of all the word lines and all the bit lines is previously set to the first unselect voltage $V_{WE}/3$ that is one third of the programming voltage $V_{WE}$ in a precharging period (action preparing time) just before the programming action is started. Alternatively, the voltage of all the word lines and all the bit lines may be set to the first unselect voltage $V_{WE}/3$ in a standby time of the device of the present invention.

During a programming action period Tw, the second unselect voltage $2V_{WE}/3$ that is two thirds of the programming voltage $V_{WE}$ is applied to all unselected word lines, the first unselect voltage $V_{WE}/3$ that is one third of the programming voltage $V_{WE}$ is applied to all unselected bit lines similar to during the precharging period, and the ground voltage Vss (corresponding to a second programming voltage) is applied to the selected word line, and the programming voltage $V_{WE}$ (corresponding to a first programming voltage) is applied to the selected bit line. During the programming action period Tw, since the voltage deference of the programming voltage $V_{WE}$ is generated between the selected bit line and the selected word line, the programming voltage $V_{WE}$ is applied to the variable resistance element in the selected memory cell and data can be programmed. At this time, although the first unselect voltage $V_{WE}/3$ that is one third of the programming voltage $V_{WE}$ is applied to the memory cell connected to the selected word line and unselected bit lines and the memory cell connected to the selected bit line and unselected word lines, since the voltage is sufficiently lower than the programming voltage $V_{WE}$, programming is not performed.

Figure 25:
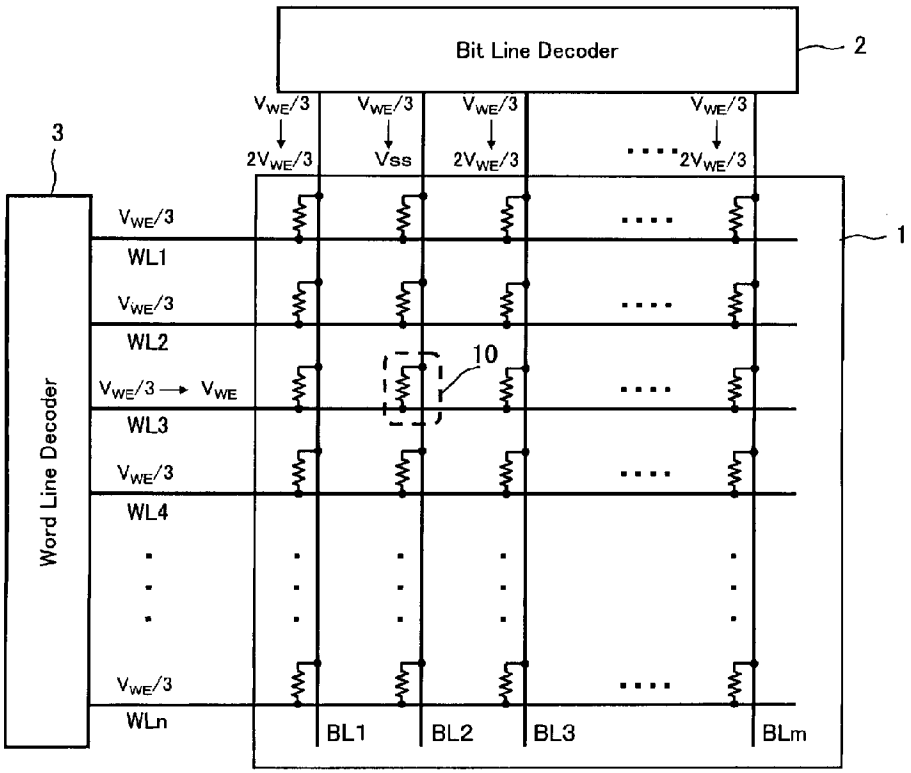
FIG. 25 is a circuit diagram showing an electric pulse applying process to each word line and each bit line at the time of erasing action in the third embodiment of the nonvolatile semiconductor memory device according to the present invention.
Figure 26:
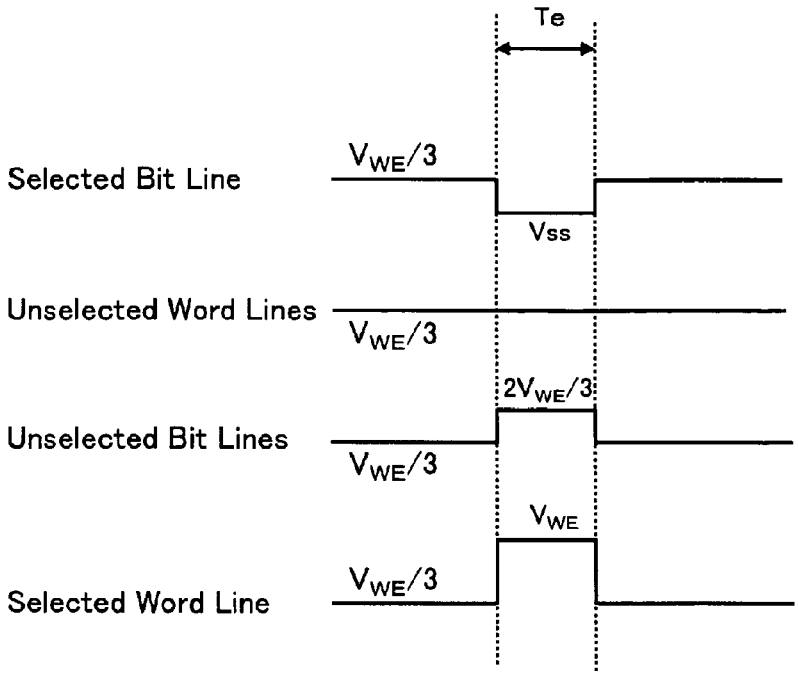
FIG. 26 is a timing chart showing the electric pulse applying process to each word line and each bit line at the time of erasing action in the third embodiment of the nonvolatile semiconductor memory device according to the present invention.

FIGS. 25 and 26 show one example of the electric pulse applying process at the time of the erasing action. When the data of the selected memory cell is erased, the voltage of all the word lines and all the bit lines is previously set to the first unselect voltage $V_{WE}/3$ that is one third of the erasing voltage $V_{WE}$ in a precharging period (action preparing period) just before the erasing action is started. Alternatively, the voltage of all the word lines and all the bit lines may be set to the first unselect voltage $V_{WE}/3$ in a standby time of the device of the present invention.

During an erasing action period Te, the first unselect voltage $V_{WE}/3$ that is one third of the erasing voltage $V_{WE}$ is continuously applied to all unselected word lines similar to during the precharging period, the second unselect voltage $2V_{WE}/3$ that is two thirds of the erasing voltage $V_{WE}$ is applied to all unselected bit lines, the erasing voltage $V_{WE}$ is applied to the selected word line, and the ground voltage Vss is applied to the selected bit line. During the erasing action period Te, since the voltage deference of the erasing voltage $V_{WE}$ that is equal to the programming voltage $V_{WE}$ but has the opposite polarity is generated between the selected word line and the selected bit line, the erasing voltage $V_{WE}$ is applied to the variable resistance element in the selected memory cell and data can be erased. At this time, although the first unselect voltage $V_{WE}/3$ that is one third of the erasing voltage $V_{WE}$ is applied to the memory cell connected to the selected word line and unselected bit lines and the memory cell connected to the selected bit line and unselected word lines, since the voltage is sufficiently lower than the erasing voltage $V_{WE}$, erasing is not performed.

Figure 27:
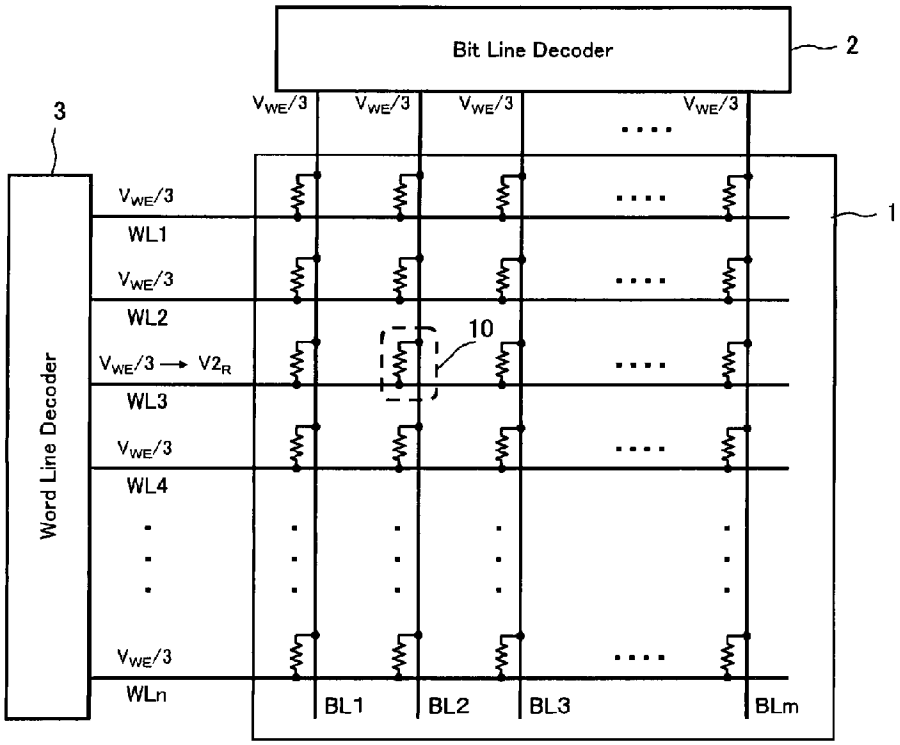
FIG. 27 is a circuit diagram showing an electric pulse applying process to each word line and each bit line at the time of reading action in the third embodiment of the nonvolatile semiconductor memory device according to the present invention.
Figure 28:
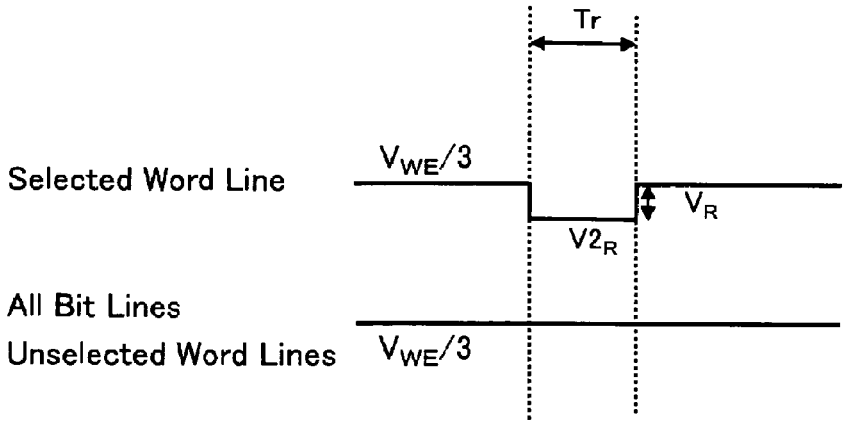
FIG. 28 is a timing chart showing the electric pulse applying process to each word line and each bit line at the time of reading action in the third embodiment of the nonvolatile semiconductor memory device according to the present invention.

FIGS. 27 and 28 show one example of the electric pulse applying process at the time of the reading action. When the data of the selected memory cell is read, the voltage of all the word lines and all the bit lines is previously set to the first unselect voltage $V_{WE}/3$ that is one third of the programming voltage $V_{WE}$ in a precharging period (action preparing period) just before the reading action is started. Alternatively, the voltage of all the word lines and all the bit lines may be set to the first unselect voltage $V_{WE}/3$ in a standby time of the device of the present invention.

During a reading action period Tr, the first unselect voltage $V_{WE}/3$ is continuously applied to all unselected word lines and all unselected bit lines and all selected bit line, and the first reading voltage $V2_R$ is applied to the selected word line. Here, the first reading voltage $V2_R$ is set to the voltage difference ($V2_R - V_{WE}/3 - V_R$) between the first unselect voltage $V_{WE}/3$ and the reading voltage $V_R$. As a result, since the voltage deference of the reading voltage $V_R$ is generated between the selected bit line and the selected word line during the reading action period Tr, the reading voltage $V_R$ can be applied to the variable resistance element of the selected memory cell, and the state of the resistance of the variable resistance element can be read. The reading voltage $V_R$ is below the programming voltage $V_{WE}$ and it only has to be enough for reading circuit 9 to read the data. The reading voltage $V_R$ can be the first unselect voltage $V_{WE}/3$ that is one third of the programming voltage $V_{WE}$ by adjusting the material, composition, film thickness, area and the like of the variable resistance element. In this case, since the first reading voltage $V2_R$ is equal to the ground voltage Vss, the number of kinds of the voltages supplied to the voltage switch 8f can be reduced.

As described above, since the common first unselect voltage $V_{WE}/3$ is applied to the unselected word lines and the unselected bit lines during the precharging period of each memory action of programming, erasing, and reading, in the case of moving to a certain memory action from a certain precharging period, each memory action can be performed only by changing the voltages of the selected word line and the selected bit line. In addition, between the reading action and programming action, by applying the common first unselect voltage $V_{WE}/3$ to the unselected bit lines in each action period, even when the action is directly shifted between the reading action and programming action, the voltage is not changed in the unselected bit lines and the voltage change of the unselected word lines remains at the first unselect voltage $V_{WE}/3$. Furthermore, between the reading action and erasing action, by applying the common first unselect voltage $V_{WE}/3$ to the unselected word lines in each action period, even when the action is directly shifted between the reading action and erasing action; the voltage is not changed in the unselected word lines and the voltage change of the unselected bit lines remains at the first unselect voltage $V_{WE}/3$. Thus, the current consumption generated by a transient current accompanied by charging and discharging of the parasitic capacity, to set each word line and each bit line at a predetermined voltage during each memory action can be considerably reduced.

Fourth Embodiment

Next, a description will be made of a fourth embodiment in which the common second unselect voltage $2V_{WE}/3$ that is two thirds of the programming voltage $V_{WE}$ is applied to the unselected word lines and the unselected bit lines in each memory action of programming, erasing and reading in the device of the present invention, with reference to FIGS. 29 to 35.

Figure 29:
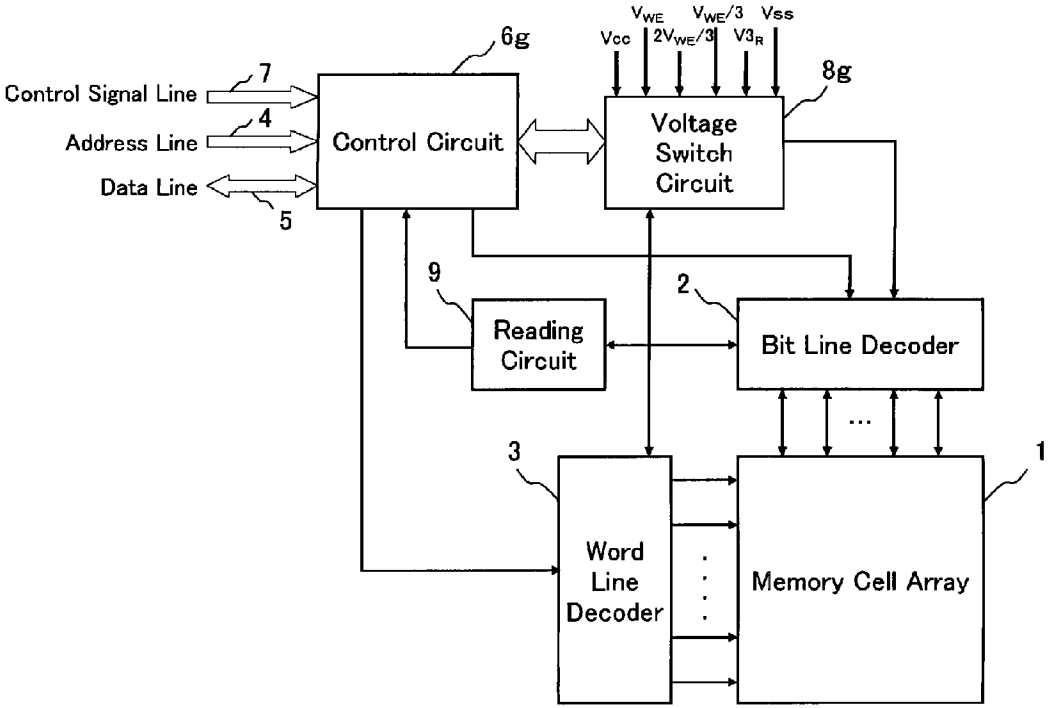
FIG. 29 is a block diagram showing a whole schematic constitution example in a fourth embodiment of a nonvolatile semiconductor memory device according to the present invention.
Figure 30:
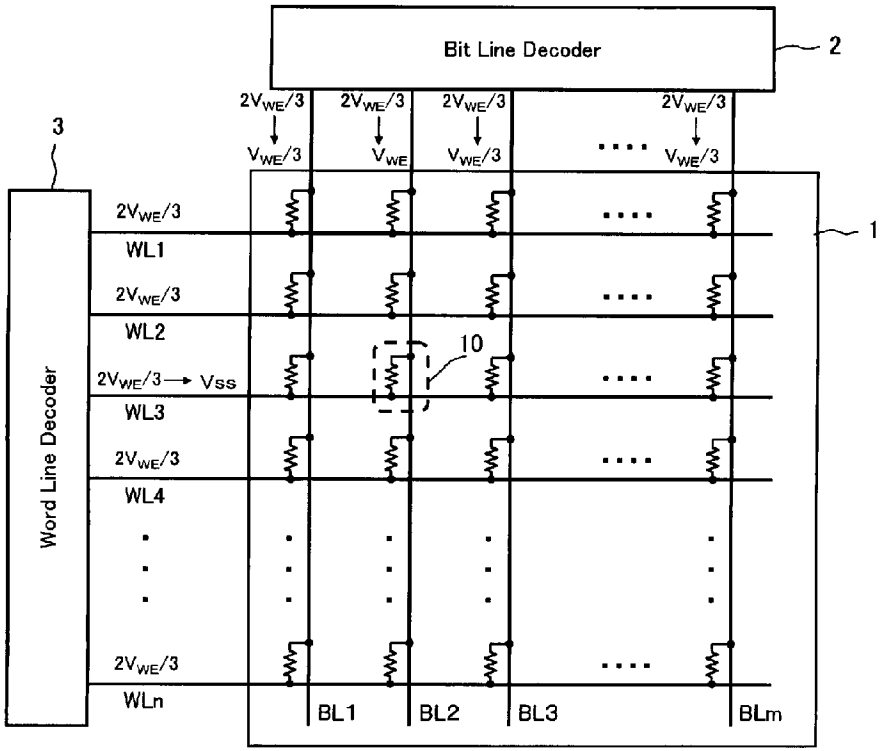
FIG. 30 is a circuit diagram showing an electric pulse applying process to each word line and each bit line at the time of programming action in the fourth embodiment of the nonvolatile semiconductor memory device according to the present invention.

FIG. 29 is a block diagram showing the functional constitution of a device of the present invention according to the third embodiment. In FIG. 29, a description will be made such that a common sign is allotted to a part common to that in the conventional nonvolatile semiconductor memory device and the first embodiment. As shown in FIG. 29, the device of the present invention comprises a bit line decoder 2, a word line decoder 3, a voltage switch circuit 8g, a reading circuit 9, and a control circuit 6g around a memory cell array 1 in which 1R type memory cells are arranged like a matrix as shown in FIG. 30. Basically, the constitution is the same as that of the conventional nonvolatile semiconductor memory device shown in FIG. 1 and the first embodiment in FIG. 8. It is different from the first embodiment in the voltages applied to each word line and each bit line of the memory cell array 1 from the voltage switch circuit 8g and the control action of the applied voltage by the control circuit 6g. The constitution of the memory cell array 1 is also the same as the memory cell array 1 of the conventional nonvolatile semiconductor memory device shown in FIG. 2 and the first embodiment shown in FIG. 9.

The description will not be made of the same component as that in the first embodiment but will be made of the voltage switch circuit 8g and the control circuit 6g.

The control circuit 6g controls each memory action of programming, erasing and reading of the memory cell array 1 similar to the first embodiment. Although the basic control action is the same as that of the first embodiment, it is different from the first embodiment in that among the voltages supplied from the voltage switch circuit 8g, the voltage $V_{WE}/3$ that is one third of the programming voltage $V_{WE}$ as a first unselect voltage and the voltage $2V_{WE}/3$ that is two thirds of the programming voltage $V_{WE}$ as a second unselect voltage are applied to the unselected word lines and the unselected bit lines. The control circuit 6g controls the word line decoder 3, the bit line decoder 2, the voltage switch circuit 8g and the reading, programming and erasing actions of the memory cell array 1, based on an address signal inputted from an address line 4, a data input (at the time of programming) inputted from a data line 5, and a control input signal inputted from a control signal line 7. In the example shown in FIG. 29, the control circuit 6g is provided with a function as a general address buffer circuit, data input/output buffer circuit, control input buffer circuit though they are not shown.

The voltage switch circuit 8g switches each voltage of the word line and bit line required for the reading action, programming action and erasing action of the memory cell array 1 according to an action mode and supplies it to the memory cell array 1. Similar to the first embodiment, in the reading action, the memory cells connected to one selected word line selected by the word line decoder 3 become the selected memory cells, and in the programming action and the erasing action, the memory cell connected to one selected word line selected by the word line decoder 3 and to one or more selected bit lines selected by the bit line decoder 2 becomes the selected memory cell, and according to each action mode of the programming, erasing and reading, the predetermined programming voltage $V_{WE}$, erasing voltage $V_{WE}$ or reading voltage $V_R$ is applied between the selected word line and the selected bit line. In the drawing, reference character Vcc designates a power supply voltage of the device of the present invention, reference character Vss designates the ground voltage, reference character $V_{WE}$ designates a programming voltage and an erasing voltage, reference character $V_{WE}/3$ designates a first unselect voltage, reference character 2 $V_{WE}/3$ designates a second unselect voltage, and reference character $V3_R$ designates a first reading voltage, which are supplied from the outside or generated in an internal circuit (not shown) and applied to the voltage switch circuit 8g and to a certain word line and bit line. The first reading voltage $V3_R$ is used in generating the reading voltage $V_R$ required for reading the data of the 1R type memory cell.

Next, an electric pulse applying process for applying a predetermined voltage to each of the selected word line, selected bit line, unselected word lines and unselected bit lines in each of the programming action, the erasing action and reading action of the data in the memory cell array 1 according to the fourth embodiment will be described with respect to each memory action.

Figure 31:
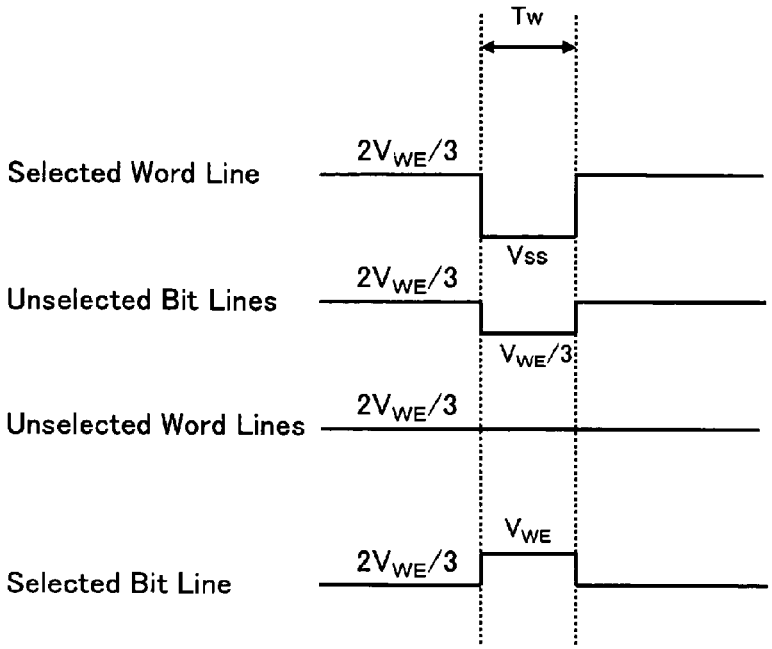
FIG. 31 is a timing chart showing the electric pulse applying process to each word line and each bit line at the time of programming action in the fourth embodiment of the nonvolatile semiconductor memory device according to the present invention.

FIGS. 30 and 31 show one example of the electric pulse applying process in the programming action. When data is programmed in the selected memory cell, the voltage of all the word lines and all the bit lines is previously set to the second unselect voltage $2V_{WE}/3$ that is two thirds of the programming voltage $V_{WE}$ in a precharging period (action preparing time) just before the programming action is started. Alternatively, the voltage of all the word lines and all the bit lines may be set to the second unselect voltage $2V_{WE}/3$ in a standby time.

During a programming action period Tw, the second unselect voltage $2V_{WE}/3$ that is two thirds of the programming voltage $V_{WE}$ is continuously applied to all unselected word lines similar to during the precharging period, the first unselect voltage $V_{WE}/3$ that is one third of the programming voltage $V_{WE}$ is applied to all unselected bit lines, and the ground voltage Vss (corresponding to the second programming voltage) is applied to the selected word line, and the programming voltage $V_{WE}$ (corresponding to the first programming voltage) is applied to the selected bit line. During the programming action period Tw, since the voltage deference of the programming voltage $V_{WE}$ is generated between the selected bit line and the selected word line, the programming voltage $V_{WE}$ is applied to the variable resistance element in the selected memory cell and data can be programmed. At this time, although the first unselect voltage $V_{WE}/3$ that is one third of the programming voltage $V_{WE}$ is applied to the memory cell connected to the selected word line and unselected bit lines and the memory cell connected to the selected bit line and unselected word lines, since the voltage is sufficiently lower than the programming voltage $V_{WE}$, programming is not performed.

Figure 32:
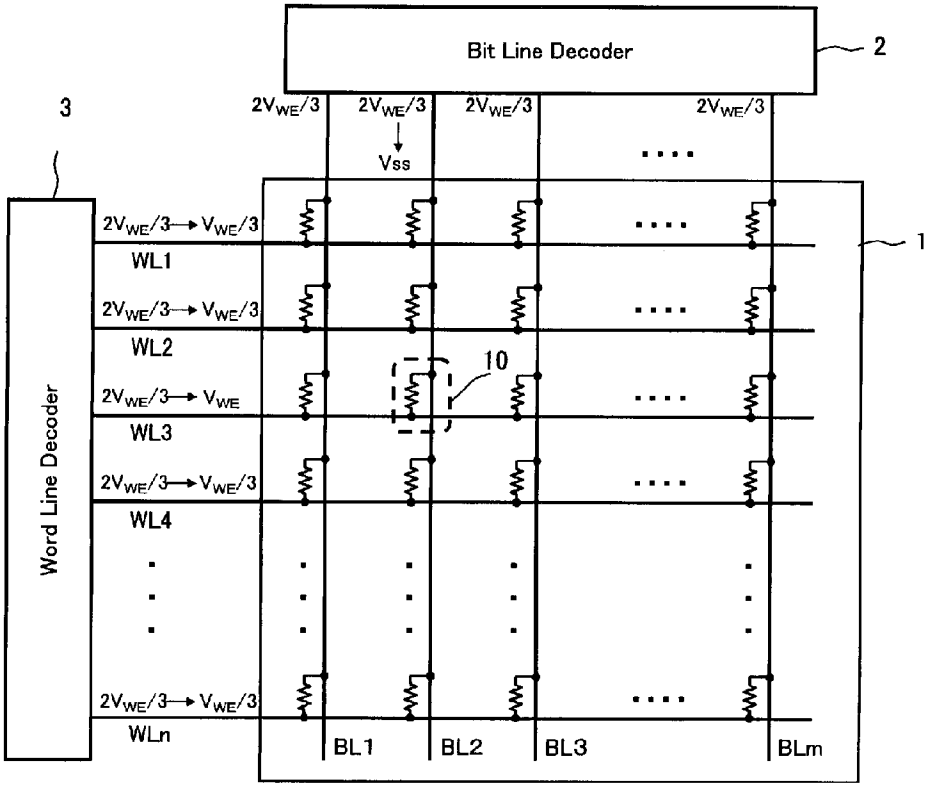
FIG. 32 is a circuit diagram showing an electric pulse applying process to each word line and each bit line at the time of erasing action in the fourth embodiment of the nonvolatile semiconductor memory device according to the present invention.
Figure 33:
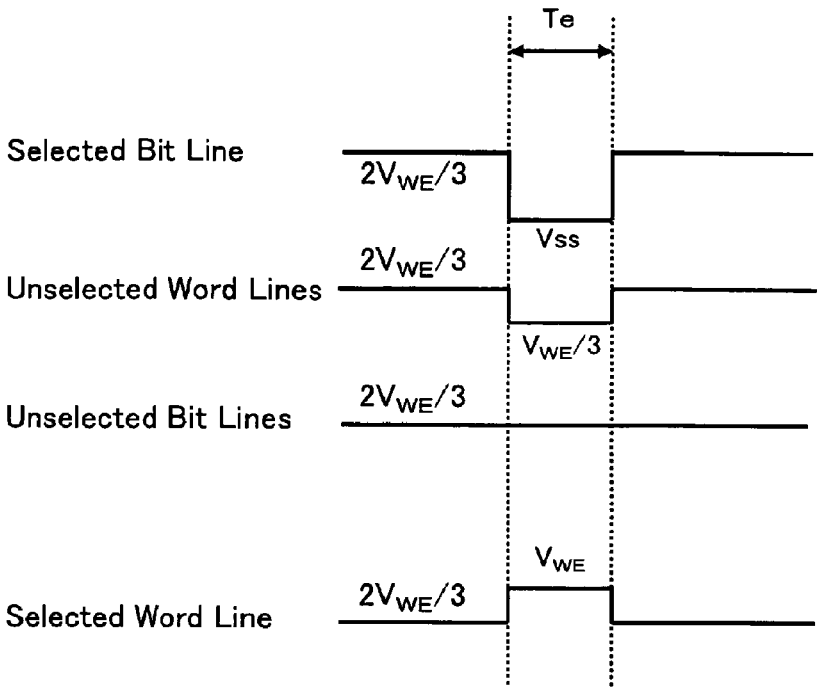
FIG. 33 is a timing chart showing the electric pulse applying process to each word line and each bit line at the time of erasing action in the fourth embodiment of the nonvolatile semiconductor memory device according to the present invention.

FIGS. 32 and 33 show one example of the electric pulse applying process at the time of the erasing action. When the data of the selected memory cell is erased, the voltage of all the word lines and all the bit lines is previously set to the second unselect voltage $2V_{WE}/3$ that is two thirds of the erasing voltage $V_{WE}$ in a precharging period (action preparing period) just before the erasing action is started. Alternatively, the voltage of all the word lines and all the bit lines may be set to the second unselect voltage $2V_{WE}/3$ in a standby time of the device of the present invention.

During an erasing action period Te, the second unselect voltage $2V_{WE}/3$ that is two thirds of the erasing voltage $V_{WE}$ is continuously applied to all unselected bit lines similar to during the precharging period, the first unselect voltage $V_{WE}/3$ that is one third of the erasing voltage $V_{WE}$ is applied to all unselected word lines, the erasing voltage $V_{WE}$ is applied to the selected word line, and the ground voltage Vss is applied to the selected bit line. During the erasing action period Te, since the voltage deference of the erasing voltage $V_{WE}$ that is equal to the programming voltage $V_{WE}$ but has the opposite polarity is generated between the selected word line and the selected bit line, the erasing voltage $V_{WE}$ is applied to the variable resistance element in the selected memory cell and data can be erased. At this time, although the first unselect voltage $V_{WE}/3$ that is one third of the erasing voltage $V_{WE}$ is applied to the memory cell connected to the selected word line and unselected bit lines and the memory cell connected to the selected bit line and unselected word lines, since the voltage is sufficiently lower than the erasing voltage $V_{WE}$, erasing is not performed.

Figure 34:
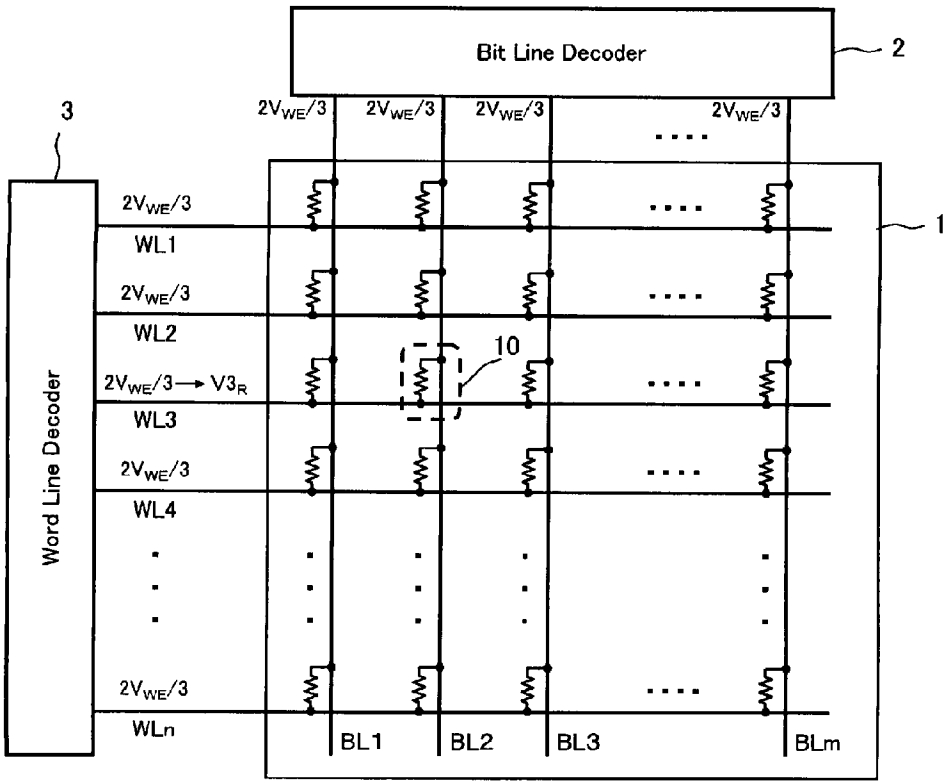
FIG. 34 is a circuit diagram showing an electric pulse applying process to each word line and each bit line at the time of reading action in the fourth embodiment of the nonvolatile semiconductor memory device according to the present invention.
Figure 35:
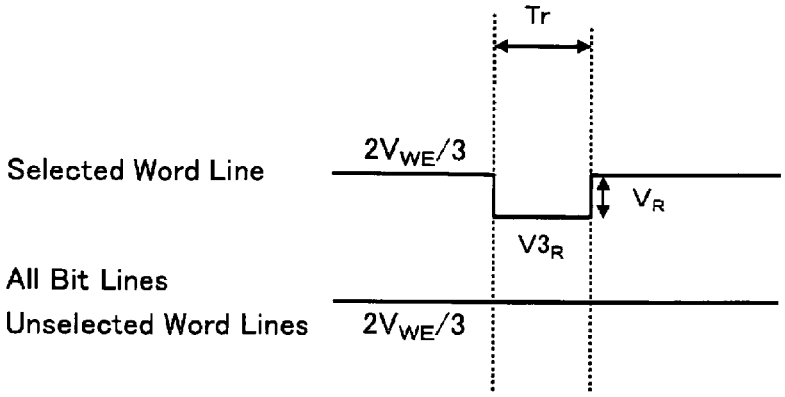
FIG. 35 is a timing chart showing the electric pulse applying process to each word line and each bit line at the time of reading action in the fourth embodiment of the nonvolatile semiconductor memory device according to the present invention.

FIGS. 34 and 35 show one example of the electric pulse applying process at the time of the reading action. When the data of the selected memory cell is read, the voltage of all the word lines and all the bit lines is previously set to the second unselect voltage $2V_{WE}/3$ that is two thirds of the programming voltage $V_{WE}$ in a precharging period (action preparing period) just before the reading action is started. Alternatively, the voltage of all the word lines and all the bit lines may be set to the second unselect voltage $2V_{WE}/3$ in a standby time of the device of the present invention.

During a reading action period Tr, the second unselect voltage $2V_{WE}/3$ is continuously applied to all unselected word lines and all unselected bit lines and the selected bit line, and the first reading voltage $V3_R$ is applied to the selected word line. Here, the first reading voltage $V3_R$ is set to the voltage difference ($V3_R-2V_{WE}/3V_R$) between the second unselect voltage $2V_{WE}/3$ and the reading voltage $V_R$. As a result, since the voltage deference of the reading voltage $V_R$ is generated between the selected bit line and the selected word line during the reading action period Tr, the reading voltage $V_R$ can be applied to the variable resistance element of the selected memory cell, and the state of the resistance of the variable resistance element can be read. The reading voltage $V_R$ is below the programming voltage $V_{WE}$ and it only has to be enough for reading circuit 9 to read the data. The reading voltage $V_R$ can be the first unselect voltage $V_{WE}/3$ that is one third of the programming voltage $V_{WE}$ by adjusting the material, composition, film thickness, area and the like of the variable resistance element. In this case, since the first reading voltage $V3_R$ is equal to the first unselect voltage $V_{WE}/3$, the number of kinds of the voltages supplied to the voltage switch 8g can be reduced.

As described above, since the common second unselect voltage $2V_{WE}/3$ is applied to the unselected word lines and the unselected bit lines during the precharging period in each memory action of programming, erasing, and reading, in the case of moving to a certain memory action from a certain precharging period, each memory action can be performed only by changing the voltages of the selected word line and the selected bit line. In addition, between the reading action and the programming action, by applying the common second unselect voltage $2V_{WE}/3$ to the unselected word lines in each action period, even when the action is directly shifted between the reading action and programming action, the voltage is not changed in the unselected word lines and the voltage change of the unselected bit lines remains at the first unselect voltage $V_{WE}/3$. Furthermore, between the reading action and erasing action, by applying the common second unselect voltage $2V_{WE}/3$ to the unselected bit lines in each action period, even when the action is directly shifted between the reading action and erasing action, the voltage is not changed in the unselected bit lines and the voltage change of the unselected word lines remains at the first unselect voltage $V_{WE}/3$. Thus, the current consumption generated by a transient current accompanied by charging and discharging of the parasitic capacity, to set each word line and each bit line at a predetermined voltage during each memory action can be considerably reduced.

Next, another embodiment of the device and method of the present invention will be described.

(1) Although the case where one word line is selected and the reading current flowing in the selected memory cells connected to that selected word line is selected on the bit line side and read has been described in the above first to fourth embodiments, the relation between the word line and the bit line may be reversed such that one bit line is selected and the reading current flowing in the selected memory cells connected to that selected bit line is selected on the word line side and read. In this case, the reading circuit 9 is connected to the word line decoder 3.

(2) Although the voltage switch circuits 8d, 8e, 8f, or 8g shown in FIG. 8, 15, 22 or 29 generates the voltages for programming, erasing and reading in the above first to fourth embodiments, there may be provided circuits each generating the voltage for each action.

As described above, according to the device and method of the present invention, the current consumption of the nonvolatile semiconductor memory device comprising the memory cell array in which the 1R type memory cells are arranged in the row and column directions like a matrix can be reduced by reducing the number of the word lines and bit lines in which the potential is changed at the time of shifting between the memory actions to reduce the transient current caused by the charging and discharging of the parasitic capacity in each word line and each bit line.

INDUSTRIAL APPLICABILITY

The present invention can be applied to a nonvolatile semiconductor memory device and particularly to a voltage control technique for the bit line and word line in each memory action of reading, programming and erasing in a semiconductor memory device comprising a memory cell array in which two-terminal memory cells comprising a variable resistance element having a resistance value reversibly changed by electric pulse application and storing information by the change of the electric resistance are arranged in the row direction and column direction.

The invention claimed is:

1. A nonvolatile semiconductor memory device comprising:

a memory cell array [comprising] *including* two-terminal memory cells each comprising a variable resistance element having a resistance value reversibly changed by electric pulse application, the memory cells being arranged in a row direction and column direction such that one end of each memory cell in the same row is connected to a common word line and the other end of each memory cell in the same column is connected to a common bit line;

a memory cell selecting circuit [selecting the] *configured to select a* memory cell from the memory cell array by the row[, column or] *or column of the* memory cell *array*;

a voltage switch circuit [applying] *configured to apply* a voltage required for each of a plurality of memory actions including a reading action, a programming action and an erasing action in the memory cell selected by the memory cell selecting circuit, to a selected word line and a selected bit line connected to [a] *the* selected memory cell and to unselected word lines and unselected bit lines other than the above selected word line and selected bit line among word lines and bit lines, according to the memory actions; and a reading circuit [reading] *configured to read* information stored in the *selected* memory cell to be read [in the selected memory cells] by detecting [the] *an* amount of a reading current flowing according to the resistance value of the variable resistance element in the *selected* memory cell to be read, wherein the voltage switch circuit [applies] *is further configured to:*

*apply* a common unselect voltage to both the unselected word lines and the unselected bit lines during [each of] the reading[,] *actions;*

*apply the common unselect voltage to both the unselected word lines and the unselected bit lines during the* programming *actions;* and

*apply the common unselect voltage to both the unselected word lines and the unselected bit lines during the* erasing actions*, wherein the common unselect voltage has an absolute value greater than zero.*

2. A nonvolatile semiconductor memory device comprising:

a memory cell array [comprising] *including* two-terminal memory cells each comprising a variable resistance element having a resistance value reversibly changed by electric pulse application, the memory cells being arranged in a row direction and column direction such that one end of each memory cell in the same row is connected to a common word line and the other end of each memory cell in the same column is connected to a common bit line;

a memory cell selecting circuit *configured to select a memory cell by* selecting the memory cell from the memory cell array by the row[, column] or *column of the* memory cell *array*;

a voltage switch circuit [applying] *configured to apply* a voltage required for each of a plurality of memory actions including a reading action, a programming action and an erasing action in the memory cell selected by the memory cell selecting circuit, to a selected word line and a selected bit line connected to [a] *the* selected memory cell and to unselected word lines and unselected bit lines other than the above selected word line and selected bit line among word lines and bit lines, according to the memory actions; and a reading circuit [reading] *configured to read* information stored in the *selected* memory cell to be read [in the selected memory cells] by detecting [the] *an* amount of a reading current flowing according to the resistance value of the variable resistance element in the *selected* memory cell to be read, wherein the voltage switch circuit [applies] *is further configured to:*

*apply* a common unselect voltage to [one of] the unselected word lines [and the unselected bit lines at least] during [each of] the reading *actions* and *the* programming actions[,] and [applies] *to apply* the common unselect voltage to [the other of the unselected word lines and] the unselected bit lines [at least] during [each of] the reading *actions* and *the* erasing actions, *or*

*apply the common unselect voltage to the unselected bit lines during the reading actions and the programming actions and to apply the common unselect voltage to the unselected word lines during the reading actions and the erasing actions, and wherein the common unselect voltage has an absolute value greater than zero*.

3. The nonvolatile semiconductor memory device according to claim 1, wherein the voltage switch circuit [applies] *is further configured to apply* the *common* unselect voltage to at least the unselected word lines and the unselected bit lines during each of action preparing periods just before the reading, programming and erasing actions.

4. The nonvolatile semiconductor memory device according to claim 3, wherein the *common* unselect voltage is applied to the selected word line and the selected bit line during each of the action preparing periods.

5. The nonvolatile semiconductor memory device according to claim 1, wherein the voltage switch circuit applies the *common* unselect voltage to one of the selected word line and the selected bit line and both of the unselected word lines and the unselected bit lines and applies a first reading voltage different from the unselect voltage to the other of the selected word line and the selected bit line, during the reading action, and

*wherein* the absolute value of voltage difference between the first reading voltage and the unselect voltage is a predetermined reading voltage lower than the lower limit value of absolute values of a programming voltage required for the programming action for the variable resistance element and an erasing voltage required for the erasing action for the variable resistance element.

6. The nonvolatile semiconductor memory device according to claim 1, wherein the voltage switch circuit [applies] *is further configured to apply* a first programming voltage higher than the *common* unselect voltage to one of the selected word line and the selected bit line and applies a second programming voltage lower than the *common* unselect voltage to the other of the selected word line and the selected bit line during the programming action, and

*wherein* the absolute value of voltage difference between the first programming voltage and the second programming voltage is a programming voltage required for the programming action for the variable resistance element.

7. The nonvolatile semiconductor memory device according to claim 1, wherein the voltage switch circuit [applies] *is further configured to apply* a first erasing voltage higher than the *common* unselect voltage to one of the selected word line and selected bit line and applies a second erasing voltage lower than the *common* unselect voltage to the other of the selected word line and the selected bit line during the erasing action, and

*wherein* the absolute value of voltage difference between the first erasing voltage and the second erasing voltage is an erasing voltage required for the erasing action for the variable resistance element.

8. The nonvolatile semiconductor memory device according to claim 1, wherein the voltage switch circuit [applies] *is further configured to apply* a first programming voltage higher than the *common* unselect voltage to one of the selected word line and selected bit line and applies a second programming voltage lower than the *common* unselect voltage to the other of the selected word line and the selected bit line during the programming action, and applies a first erasing voltage higher than the *common* unselect voltage to the other of the selected word line and selected bit line and applies a second erasing voltage lower than the *common* unselect voltage to one of the selected word line and the selected bit line during the erasing action,

*wherein* the absolute value of voltage difference between the first programming voltage and the second programming voltage is a programming voltage required for the programming action for the variable resistance element, and the absolute value of voltage difference between the first erasing voltage and the second erasing voltage is an erasing voltage required for the erasing action for the variable resistance element, and

*wherein* the first programming voltage is equal to the first erasing voltage and the second programming voltage is equal to the second erasing voltage.

9. The nonvolatile semiconductor memory device according to claim 1, wherein a voltage applied to the selected word line or the selected bit line during both of the programming and erasing actions is the ground voltage, and

*wherein* the *common* unselect voltage is half of a programming voltage required for the programming action for the variable resistance element or an erasing voltage required for the erasing action for the variable resistance element.

[10. The nonvolatile semiconductor memory device according to claim 1, wherein a voltage applied to the selected word line or the selected bit line during both of the programming and erasing actions is the ground voltage, and the unselect voltage is one third of a programming voltage required for the programming action for the variable resistance element or an erasing voltage required for the erasing action for the variable resistance element.]

[11. The nonvolatile semiconductor memory device according to claim 1, wherein a voltage applied to the selected word line or the selected bit line during both of the programming and erasing actions is the ground voltage, and the unselect voltage is two thirds of a programming voltage required for the programming action for the variable resistance element or an erasing voltage required for the erasing action for the variable resistance element.]

[12. The nonvolatile semiconductor memory device according to claim 1, wherein a polarity of one of voltages applied to the selected word line and the selected bit line is positive and a polarity of the other thereof is negative during both of the programming and erasing actions, and the absolute values of them is the same, and the unselect voltage is the ground voltage.]

13. The nonvolatile semiconductor memory device according to claim 1, wherein the voltage switch circuit [applies] *is further configured to apply* the *common* unselect voltage to the selected word line, selected bit line, unselected word lines and unselected bit lines in a standby state in which none of the reading, programming and erasing actions is performed.

14. The nonvolatile semiconductor memory device according to claim 1, wherein the [material of the] variable resistance element [is] *comprises* a metal oxide.

15. The nonvolatile semiconductor memory device according to claim [1] *14*, wherein the metal oxide [as the material of the variable resistance element is] *comprises* a transition metal oxide.

16. The nonvolatile semiconductor memory device according to claim [1] *14*, wherein the metal oxide [as the material of the variable resistance element contains] *comprises* Pr and Mn.

17. An operating method in a nonvolatile semiconductor memory device comprising a memory cell array [comprising] *including* two-terminal memory cells each comprising a variable resistance element having a resistance value reversibly changed by electric pulse application, the memory cells being arranged in a row direction and column direction such that one end of each memory cell in the same row is connected to a common word line and the other end of each memory cell in the same column is connected to a common bit line, for a plurality of memory actions including a reading action, a programming action and an erasing action in a selected memory cell selected from the memory cell array by the row[,] *or* column[, or memory cell] *of the memory cell array*, the operating method comprising:

applying a common unselect voltage to both of unselected word lines and unselected bit lines that are not connected to the selected memory cell among word lines and bit lines during [each of] the reading, programming and erasing actions[.]*;*

*applying the common unselect voltage to both the unselected word lines and the unselected bit lines during the programming actions; and*

*applying the common unselect voltage to both the unselected word lines and the unselected bit lines during the erasing actions, wherein the common unselect voltage has an absolute value greater than zero.*

18. An operating method in a nonvolatile semiconductor memory device comprising a memory cell array [comprising] *including* two-terminal memory cells each comprising a variable resistance element having a resistance value reversibly changed by electric pulse application, the memory cells being arranged in a row direction and column direction such that one end of each memory cell in the same row is connected to a common word line and the other end of each memory cell in the same column is connected to a common bit line, for a plurality of memory actions including a reading action, a programming action and an erasing action in a selected memory cell selected from the memory cell array by the row[.] *or* column[, or memory cell] *of the memory cell array*, the operating method comprising:

applying a common unselect voltage to [one of] unselected word lines [and unselected bit lines] that are not connected to the selected memory cell among word lines [and bit lines at least] during [each of] the reading *actions* and *the* programming actions[.] and *to apply* the *common* unselect voltage to [the other of the unselected word lines and the] unselected bit lines [at least] *that are not connected to the selected memory cell among bit lines* during [each of] the reading *actions* and *the* erasing actions*, or*

*applying the common unselect voltage to the unselected bit lines during the reading actions and the programming actions and to apply the common unselect voltage to the unselected word lines during the reading actions and the erasing actions, wherein the common unselect voltage has an absolute value greater than zero.*

19. The operating method of the nonvolatile semiconductor memory device according to claim 17 comprising:

applying the *common* unselect voltage to the unselected word lines and the unselected bit lines during each of action preparing periods just before the reading, programming and erasing actions.

20. The operating method of the nonvolatile semiconductor memory device according to claim 19 comprising:

applying the *common* unselect voltage to a selected word line and a selected bit line connected to the selected memory cell among the word lines and bit lines during each of the action preparing periods.

21. The operating method of the nonvolatile semiconductor memory device according to claim 17 comprising:

applying the *common* unselect voltage to one of a selected word line and a selected bit line connected to the selected memory cell and both of the unselected word lines and the unselected bit lines and a first reading voltage different from the unselect voltage to the other of the selected word line and the selected bit line, among the word lines and bit lines, during the reading action, wherein the absolute value of voltage difference between the first reading voltage and the *common* unselect voltage is a predetermined reading voltage lower than the lower limit value of absolute values of a programming voltage required for the programming action for the variable resistance element and an erasing voltage required for the erasing action for the variable resistance element.

22. The operating method of the nonvolatile semiconductor memory device according to claim 17, wherein a voltage applied to one of a selected word line and a selected bit line connected to the selected memory cell among the word lines and the bit lines during both of the programming and erasing actions is the ground voltage, and

*wherein* the *common* unselect voltage is half of a programming voltage required for the programming action for the variable resistance element or an erasing voltage required for the erasing action for the variable resistance element.

[23. The operating method of the nonvolatile semiconductor memory device according to claim 17, wherein a voltage applied to one of a selected word line and a selected bit line connected to the selected memory cell among the word lines and the bit lines during both of the programming and erasing actions is the ground voltage, and the unselect voltage is one third of a programming voltage required for the programming action for the variable resistance element or an erasing voltage required for the erasing action for the variable resistance element.]

[24. The operating method of the nonvolatile semiconductor memory device according to claim 17, wherein a voltage applied to one of a selected word line and a selected bit line connected to the selected memory cell among the word lines and the bit lines during both of the programming and erasing actions is the ground voltage, and the unselect voltage is two thirds of a programming voltage required for the programming action for the variable resistance element or an erasing voltage required for the erasing action for the variable resistance element.]

[25. The operating method of the nonvolatile semiconductor memory device according to claim 17, wherein a polarity of one of voltages applied to a selected word line and a selected bit line connected to the selected memory cell among the word lines and the bit lines during both of the programming and erasing actions is positive and a polarity of the other thereof is negative, and the absolute values of them is the same, and the unselect voltage is the ground voltage.]

26. The operating method of the nonvolatile semiconductor memory device according to claim 17, wherein the voltage switch circuit applies the *common* unselect voltage to a selected word line and selected bit line connected to the selected memory cell, and the unselected word lines and unselected bit lines among the word lines and bit lines in a standby state in which none of the reading, programming, and erasing actions is performed.

27. The operating method of the nonvolatile semiconductor memory device according to claim 17, wherein

[the material of] the variable resistance element [is] *comprises* a metal oxide.

28. The operating method of the nonvolatile semiconductor memory device according to claim [17] *27*, wherein the metal oxide [as the material of the variable resistance element is] *comprises* a transition metal oxide.

29. The operating method of the nonvolatile semiconductor memory device according to claim [17] *27*, wherein the metal oxide [as the material of the variable resistance element contains] *comprises* Pr and Mn.

30. The nonvolatile semiconductor memory device according to claim 2, wherein the voltage switch circuit [applies] *is further configured to apply* the *common* unselect voltage to at least the unselected word lines and the unselected bit lines during each of action preparing periods just before the reading, programming and erasing actions.

31. The nonvolatile semiconductor memory device according to claim 2, wherein the voltage switch circuit [applies] *is further configured to apply* the *common* unselect voltage to one of the selected word line and the selected bit line and both of the unselected word lines and the unselected bit lines and applies a first reading voltage different from the *common* unselect voltage to the other of the selected word line and the selected bit line, during the reading action, and

*wherein* the absolute value of voltage difference between the first reading voltage and the *common* unselect voltage is a predetermined reading voltage lower than the lower limit value of absolute values of a programming voltage required for the programming action for the variable resistance element and an erasing voltage required for the erasing action for the variable resistance element.

32. The nonvolatile semiconductor memory device according to claim 2, wherein the voltage switch circuit [applies] *is further configured to apply* a first programming voltage higher than the *common* unselect voltage to one of the selected word line and the selected bit line and applies a second programming voltage lower than the *common* unselect voltage to the other of the selected word line and the selected bit line during the programming action, and

*wherein* the absolute value of voltage difference between the first programming voltage and the second programming voltage is a programming voltage required for the programming action for the variable resistance element.

33. The nonvolatile semiconductor memory device according to claim 2, wherein the voltage switch circuit [applies] *is further configured to apply* a first erasing voltage higher than the *common* unselect voltage to one of the selected word line and selected bit line and applies a second erasing voltage lower than the *common* unselect voltage to the other of the selected word line and the selected bit line during the erasing action, and

*wherein* the absolute value of voltage difference between the first erasing voltage and the second erasing voltage is an erasing voltage required for the erasing action for the variable resistance element.

34. The nonvolatile semiconductor memory device according to claim 2, wherein the voltage switch circuit [applies] *is further configured to apply* a first programming voltage higher than the *common* unselect voltage to one of the selected word line and selected bit line and applies a second programming voltage lower than the *common* unselect voltage to the other of the selected word line and the selected bit line during the programming action, and applies a first erasing voltage higher than the *common* unselect voltage to the other of the selected word line and selected bit line and applies a second erasing voltage lower than the *common* unselect voltage to one of the selected word line and the selected bit line during the erasing action,

*wherein* the absolute value of voltage difference between the first programming voltage and the second programming voltage is a programming voltage required for the programming action for the variable resistance element, and the absolute value of voltage difference between the first erasing voltage and the second erasing voltage is an erasing voltage required for the erasing action for the variable resistance element, and

*wherein* the first programming voltage is equal to the first erasing voltage and the second programming voltage is equal to the second erasing voltage.

35. The nonvolatile semiconductor memory device according to claim 2, wherein a voltage applied to the selected word line or the selected bit line during both of the programming and erasing actions is the ground voltage, and

*wherein* the *common* unselect voltage is half of a programming voltage required for the programming action for the variable resistance element or an erasing voltage required for the erasing action for the variable resistance element.

36. The nonvolatile semiconductor memory device according to claim 2, wherein a voltage applied to the selected word line or the selected bit line during both of the programming and erasing actions is the ground voltage, and

*wherein* the *common* unselect voltage is one third of a programming voltage required for the programming action for the variable resistance element or an erasing voltage required for the erasing action for the variable resistance element.

37. The nonvolatile semiconductor memory device according to claim 2, wherein a voltage applied to the selected word line or the selected bit line during both of the programming and erasing actions is the ground voltage, and

*wherein* the *common* unselect voltage is two thirds of a programming voltage required for the programming action for the variable resistance element or an erasing voltage required for the erasing action for the variable resistance element.

[38. The nonvolatile semiconductor memory device according to claim 2, wherein a polarity of one of voltages applied to the selected word line and the selected bit line is positive and a polarity of the other thereof is negative during both of the programming and erasing actions, and the absolute values of them is the same, and the unselect voltage is the ground voltage.]

39. The nonvolatile semiconductor memory device according to claim 2, wherein the voltage switch circuit [applies] *is further configured to apply* the *common* unselect voltage to the selected word line, selected bit line, unselected word lines and unselected bit lines in a standby state in which none of the reading, programming and erasing actions is performed.

40. The nonvolatile semiconductor memory device according to claim 2, wherein

[the material of] the variable resistance element [is] *comprises* a metal oxide.

41. The nonvolatile semiconductor memory device according to claim [2] *40*, wherein the metal oxide [as the material of the variable resistance element is] *comprises* a transition metal oxide.

42. The nonvolatile semiconductor memory device according to claim [2] *40*, wherein the metal oxide [as the material of the variable resistance element contains] *comprises* Pr and Mn.

43. The operating method of the nonvolatile semiconductor memory device according to claim 18 comprising:

applying the *common* unselect voltage to the unselected word lines and the unselected bit lines during each of action preparing periods just before the reading, programming and erasing actions.

44. The operating method of the nonvolatile semiconductor memory device according to claim 18 comprising:

applying the *common* unselect voltage to one of a selected word line and a selected bit line connected to the selected memory cell and both of the unselected word lines and the unselected bit lines and a first reading voltage different from the *common* unselect voltage to the other of the selected word line and the selected bit line, among the word lines and bit lines, during the reading action, wherein the absolute value of voltage difference between the first reading voltage and the *common* unselect voltage is a predetermined reading voltage lower than the lower limit value of absolute values of a programming voltage required for the programming action for the variable resistance element and an erasing voltage required for the erasing action for the variable resistance element.

45. The operating method of the nonvolatile semiconductor memory device according to claim 18, wherein a voltage applied to one of a selected word line and a selected bit line connected to the selected memory cell among the word lines and the bit lines during both of the programming and erasing actions is the ground voltage, and

*wherein* the *common* unselect voltage is half of a programming voltage required for the programming action for the variable resistance element or an erasing voltage required for the erasing action for the variable resistance element.

46. The operating method of the nonvolatile semiconductor memory device according to claim 18, wherein a voltage applied to one of a selected word line and a selected bit line connected to the selected memory cell among the word lines and the bit lines during both of the programming and erasing actions is the ground voltage, and

*wherein* the *common* unselect voltage is one third of a programming voltage required for the programming action for the variable resistance element or an erasing voltage required for the erasing action for the variable resistance element.

47. The operating method of the nonvolatile semiconductor memory device according to claim 18, wherein a voltage applied to one of a selected word line and a selected bit line connected to the selected memory cell among the word lines and the bit lines during both of the programming and erasing actions is the ground voltage, and

*wherein* the *common* unselect voltage is two thirds of a programming voltage required for the programming action for the variable resistance element or an erasing voltage required for the erasing action for the variable resistance element.

[48. The operating method of the nonvolatile semiconductor memory device according to claim 18, wherein a polarity of one of voltages applied to a selected word line and a selected bit line connected to the selected memory cell among the word lines and the bit lines during both of the programming and erasing actions is positive and a polarity of the other thereof is negative, and the absolute values of them is the same, and the unselect voltage is the ground voltage.]

49. The operating method of the nonvolatile semiconductor memory device according to claim 18, wherein the voltage switch circuit [applies] *is further configured to apply* the *common* unselect voltage to a selected word line and selected bit line connected to the selected memory cell, and the unselected word lines and unselected bit lines among the word lines and bit lines in a standby state in which none of the reading, programming, and erasing actions is performed.

50. The operating method of the nonvolatile semiconductor memory device according to claim 18, wherein

[the material of] the variable resistance element [is] *comprises* a metal oxide.

51. The operating method of the nonvolatile semiconductor memory device according to claim [18] *50*, wherein the metal oxide [as the material of the variable resistance element is] *comprises* a transition metal oxide.

52. The operating method of the nonvolatile semiconductor memory device according to claim [18] *50*, wherein the metal oxide [as the material of the variable resistance element contains] *comprises* Pr and Mn.

*53. A memory device comprising:*

*a memory cell array including memory cells, wherein a first terminal of each memory cell in a same row is connected to a common word line, and wherein a second terminal of each memory cell in a same column is connected to a common bit line; and*

*a voltage switch circuit configured to apply a voltage for each of a plurality of memory actions to a selected word line and a selected bit line connected to a selected memory cell and to unselected word lines and unselected bit lines according to the plurality of memory actions, wherein the plurality of memory actions include a reading action, a programming action, and an erasing action in the selected memory cell;*

*wherein the voltage switch circuit is further configured to:*

*apply a common unselect voltage to both the unselected word lines and the unselected bit lines during the reading actions;*

*apply the common unselect voltage to both the unselected word lines and the unselected bit lines during the programming action; and*

*apply the common unselect voltage to both the unselected word lines and the unselected bit lines during the erasing action, and wherein the common unselected voltage has an absolute value greater than zero.*

*54. The memory device of claim 53, wherein the voltage switch circuit is further configured to apply the common unselect voltage to at least the unselected word lines and the unselected bit lines during action preparing periods prior to the reading action, the programming action, and the erasing action.*

*55. The memory device of claim 53, further comprising:*

*a memory cell selecting circuit configured to select the selected memory cell from the memory cell array by row or column; and*

*a reading circuit configured to read information stored in the selected memory cell by detecting an amount of a reading current flowing according to a resistance value of a variable resistance element in the selected memory cell.*

*56. The memory device of claim 53, wherein the voltage switch circuit is further configured to apply the common unselect voltage to one of the selected word line or the selected bit line and to both of the unselected word line and the unselected bit line and apply a first reading voltage different from the common unselected voltage to the other of the selected word line or the selected bit line during the reading action.*

*57. The memory device of claim 53, wherein the voltage switch circuit is further configured to apply a first programming voltage higher than the common unselect voltage to one of the selected word line or the selected bit line and apply a second programming voltage lower than the common unselect voltage to the other of the selected word line or the selected bit line during the programming action.*

*58. The memory device of claim 53, wherein the voltage switch circuit is further configured to apply a first erasing voltage higher than the common unselect voltage to one of the selected word line or the selected bit line and apply a second erasing voltage lower than the common unselect voltage to the other of the selected word line or the selected bit line during the erasing action.*

*59. The memory device of claim 53, wherein a voltage applied to the selected word line or the selected bit line during both of the programming and erasing actions is the ground voltage, and wherein the common unselect voltage is half or less of a programming voltage for the programming action for the variable resistance element or an erasing voltage for the erasing action for the variable resistance element.*

*60. The memory device of claim 53, wherein a polarity of a first voltage applied to the selected word line and the selected bit line is positive and a polarity of a second voltage applied to the selected word line and the selected bit line is negative during both of the programming and erasing actions.*

*61. The memory device of claim 53, wherein the voltage switch circuit is further configured to apply the common unselect voltage to the selected word line, the selected bit line, the unselected word lines, and the unselected bit lines in a standby state in which none of the reading action, the programming action, or the erasing action is performed.*

*62. A memory device comprising:*

*a memory cell array including memory cells, wherein a first terminal of each memory cell in a same row is connected to a common word line, and wherein a second terminal of each memory cell in a same column is connected to a common bit line; and*

*a voltage switch circuit configured to apply a voltage for each of a plurality of memory actions to a selected word line and a selected bit line connected to a selected memory cell and to un-selected word lines and unselected bit lines according to the plurality of memory actions, wherein the plurality of memory actions include a reading action and a programming action in the selected memory cell;*

*wherein the voltage switch circuit is further configured to:*

*apply a common unselect voltage to the unselected word lines during the reading actions and the programming actions and apply the common unselect voltage to the unselected bit lines during the reading actions and the erasing actions; or*

*apply the common unselect voltage to the unselected bit lines during the reading actions and the programming actions and apply the common unselect voltage to the unselected word lines during the reading actions and the erasing actions, wherein the common unselect voltage has an absolute value greater than zero.*

*63. The memory device of claim 62, wherein the memory cells comprise a variable resistance element having a resistance value configured to reversibly change in response to electric pulse application.*

*64. The memory device of claim 63, further comprising:*

*a memory cell selecting circuit configured to select the selected memory cell from the memory cell array by row or column; and*

*a reading circuit configured to read information stored in the selected memory cell by detecting an amount of a*

*reading current flowing according to a resistance value of the variable resistance element in the selected memory cell.*

*65. The memory device of claim 63, wherein the variable resistance element comprises resistance random access memory, and wherein the voltage switch circuit is further configured to apply the common unselect voltage to the other of the unselected word lines and the unselected bit lines at least during the both the reading action and the erasing action.*

*66. The memory device of claim 62, wherein the plurality of memory actions further include an erasing action.*

*67. A memory device comprising:*

*a memory cell array including memory cells, wherein a first terminal of each memory cell in a same row is connected to a common word line, and wherein a second terminal of each memory cell in a same column is connected to a common bit line; and*

*a voltage switch circuit configured to apply a voltage for each of a plurality of memory actions to a selected word line and a selected bit line connected to a selected memory cell and to unselected word lines and unselected bit lines according to the plurality of memory actions, wherein the plurality of memory actions include a reading action and a programming action in the selected memory cell;*

*wherein the voltage switch circuit is further configured to:*

*apply a common unselect voltage to both the unselected word lines and the unselected bit lines during the reading actions; and*

*apply the common unselect voltage to both the unselected word lines and the unselected bit lines during the programming action, and wherein the unselected voltage has an absolute value greater than zero.*

*68. The nonvolatile semiconductor memory device according to claim 1, wherein the common unselect voltage is the same during each of the reading, programming, and erasing actions.*

* * * * *